(12) United States Patent
Shimizu et al.

(10) Patent No.: US 10,923,568 B2
(45) Date of Patent: Feb. 16, 2021

(54) SEMICONDUCTOR DEVICE, INVERTER CIRCUIT, AND VEHICLE

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/710,278

(22) Filed: Dec. 11, 2019

(65) Prior Publication Data

US 2020/0111875 A1    Apr. 9, 2020

Related U.S. Application Data

(60) Division of application No. 16/000,953, filed on Jun. 6, 2018, now Pat. No. 10,546,931, which is a (Continued)

(30) Foreign Application Priority Data

Mar. 24, 2015  (JP) .................................. 2015-061802
Dec. 3, 2015   (JP) .................................. 2015-236877

(51) Int. Cl.
*H01L 29/16*   (2006.01)
*H01L 29/51*   (2006.01)
*H01L 29/78*   (2006.01)

(52) U.S. Cl.
CPC ........ *H01L 29/1608* (2013.01); *H01L 29/513* (2013.01); *H01L 29/517* (2013.01); *H01L 29/518* (2013.01); *H01L 29/7802* (2013.01)

(58) Field of Classification Search
CPC . H01L 29/1608; H01L 29/513; H01L 29/517; H01L 29/518; H01L 29/7802
(Continued)

(56) References Cited

U.S. PATENT DOCUMENTS

2011/0057202 A1   3/2011 Kono
2011/0254062 A1   10/2011 Shimizu et al.
(Continued)

FOREIGN PATENT DOCUMENTS

JP    2004-193288    7/2004
JP    2010-80617 A   4/2010
(Continued)

*Primary Examiner* — Andy Huynh
(74) *Attorney, Agent, or Firm* — Oblon, McClelland, Maier & Neustadt, L.L.P.

(57) ABSTRACT

A semiconductor device includes a p-type SiC layer, a gate electrode, and a gate insulating layer between the SiC layer and the gate electrode. The gate insulating layer includes first and second layers and first and second regions. The second layer is between the first layer and the gate electrode and has a higher oxygen density than the first layer. The first region is across the first layer and the second layer, and includes at least one first element selected from the group consisting of N (nitrogen), P (phosphorus), As (arsenic), Sb (antimony), and Bi (bismuth) and the first region having a first concentration peak of the at least one first element. The second region is provided in the first layer, includes a second element from Ta (tantalum), Nb (niobium), and V (vanadium) and, the second region having a second concentration peak of the at least one second element.

10 Claims, 19 Drawing Sheets

Related U.S. Application Data continuation of application No. 15/634,116, filed on Jun. 27, 2017, now Pat. No. 10,026,813, which is a division of application No. 15/055,848, filed on Feb. 29, 2016, now Pat. No. 9,728,608.

(58) Field of Classification Search
USPC .......................................................... 257/77
See application file for complete search history.

(56) References Cited

U.S. PATENT DOCUMENTS

| | | |
|---|---|---|
| 2012/0007104 A1 | 1/2012 | Wada |
| 2012/0056195 A1 | 3/2012 | Kono |
| 2013/0062622 A1 | 3/2013 | Tsuchiya |
| 2013/0062624 A1 | 3/2013 | Tsuchiya |
| 2013/0161619 A1 | 6/2013 | Wada |
| 2014/0084303 A1 | 3/2014 | Shimizu |
| 2015/0084068 A1* | 3/2015 | Shimizu ................ H01L 21/045 257/77 |
| 2015/0372092 A1 | 12/2015 | Yamamoto |
| 2016/0056040 A1 | 2/2016 | Tanaka |
| 2016/0087064 A1 | 3/2016 | Ohashi et al. |
| 2016/0218188 A1* | 7/2016 | Hiyoshi ............. H01L 29/4236 |

FOREIGN PATENT DOCUMENTS

| | | |
|---|---|---|
| JP | 2011-228429 | 11/2011 |
| JP | 2014-183125 A | 9/2014 |
| JP | 2016-66641 | 4/2016 |
| WO | WO 2012/131898 A1 | 10/2012 |

\* cited by examiner

SEMICONDUCTOR DEVICE, INVERTER CIRCUIT, AND VEHICLE

CROSS-REFERENCE TO RELATED APPLICATION

This application is a division of and claims the benefit of priority under 35 U.S.C. § 120 from U.S. application Ser. No. 16/000,953 filed Jun. 6, 2018, which is a continuation of U.S. application Ser. No. 15/634,116 filed Jun. 27, 2017 (now U.S. Pat. No. 10,026,813 issued Jul. 17, 2018), which is a division of U.S. application Ser. No. 15/055,848 filed Feb. 29, 2016 (now U.S. Pat. No. 9,728,608 issued Aug. 8, 2017), and claims the benefit of priority under 35 U.S.C. § 119 from Japanese Patent Application No. 2015-061802 filed Mar. 24, 2015 and Japanese Patent Application No. 2015-236877 filed on Dec. 3, 2015, the entire contents of each of which are incorporated herein by reference.

FIELD

Embodiments described herein relate generally to a semiconductor device, an inverter circuit, and a vehicle.

BACKGROUND

SiC (silicon carbide) is expected as a material for a next-generation semiconductor device. SiC have excellent physical properties. In comparison with Si (silicon), a band gap is three times, breakdown electric field strength is approximately ten times, and thermal conductivity is approximately three times. A low-loss semiconductor device which can operate at a high temperature can be realized by using such properties.

However, for example, an interface state density between a semiconductor and an insulating layer is increased in the case where a metal insulator semiconductor field effect transistor (MISFET) is formed by using SiC in comparison with the case where Si is used. Therefore, there is a problem that mobility of electrical charges is decreased, and on-resistance of the MISFET is increased.

For example, there is a method in which N (nitrogen) or P (phosphorus) are introduced into the interface between SiC and an insulating layer to terminate an interface state. When this method is used, N (nitrogen) or P (phosphorus) functions as an n-type dopant, and a threshold voltage of an n-channel type MISFET may be decreased.

In order not to cause malfunction of a SiC-MOSFET, a threshold voltage at least equal to or greater than 3 V may be required at an operation temperature (for example, 200° C.), and preferably the threshold voltage is equal to or greater than 5 V. In case termination by nitrogen or phosphorus being applied, the threshold voltage may falls down to around 1 V.

DETAILED DESCRIPTION

Figure 1:
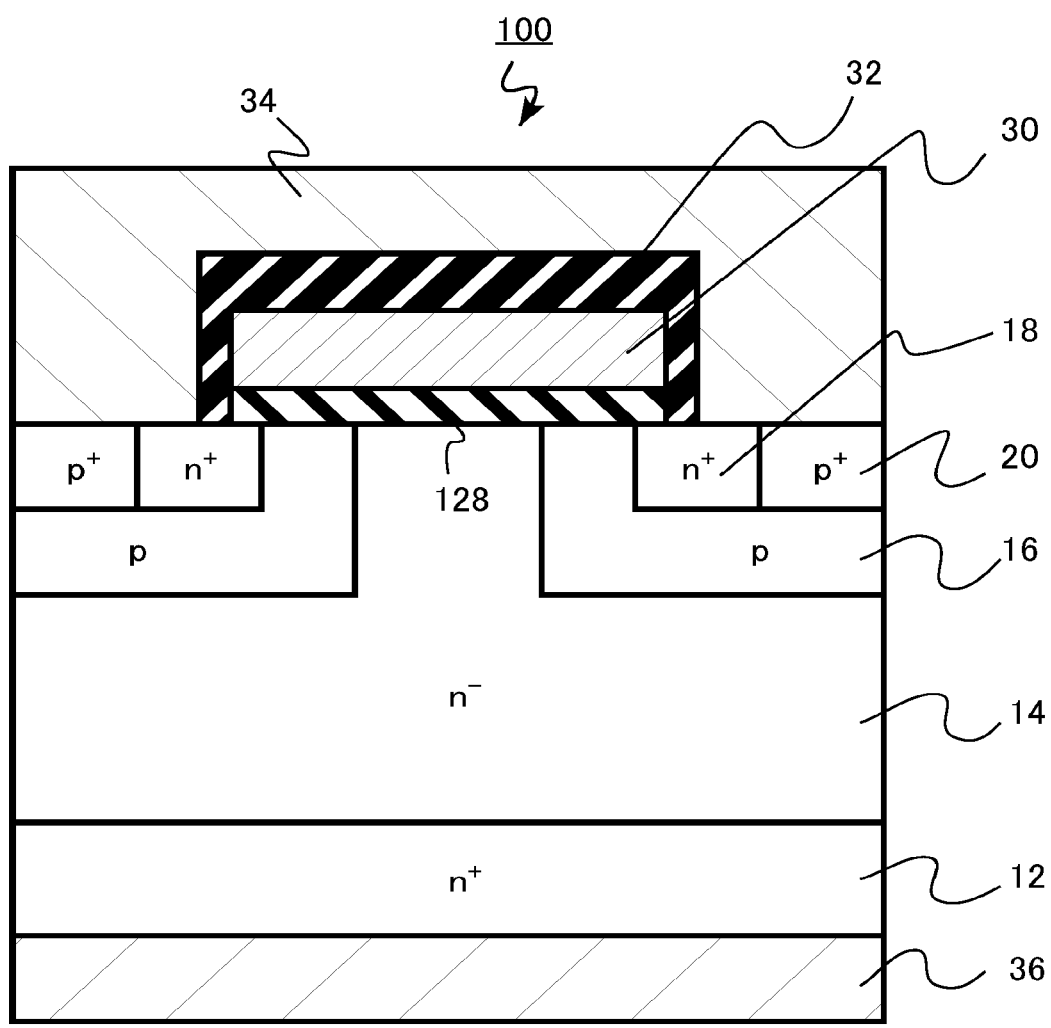
FIG. 1 is a schematic sectional view of a semiconductor device according to a first embodiment.

A semiconductor device according to embodiments described herein includes a p-type SiC layer; a gate electrode; and a gate insulating layer provided between the SiC layer and the gate electrode. The gate insulating layer including; a first layer, a second layer provided between the first layer and the gate electrode, the second layer having a higher oxygen density than the first layer, a first region provided across the first layer and the second layer, the first region including a first element which is at least one element in the group of F (fluorine), D (deuterium), and H (hydrogen) and the first region having a first concentration peak of the first element, and a second region provided in the first layer, the second region including a second element which is at least one element in the group of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) and the second region having a second concentration peak of the second element and a third concentration peak of C (carbon), a distance between the second concentration peak and the third concentration peak being shorter than a distance between the first concentration peak and the third concentration peak.

Embodiments of the present disclosure will be described below with reference to drawings. In description below, same or similar members will be denoted by same reference characters, and the description of members described once will be appropriately omitted.

Further, in description below, symbols of $n^+$, n, $n^-$ and $p^+$, p, $p^-$ indicate relative height of an impurity concentration in each conduction type. Specifically, $n^+$ indicates that an impurity concentration of an n type is relatively high in comparison with n, and $n^-$ indicates that the impurity concentration of an n type is relatively low in comparison with n. Furthermore, p+ indicates that an impurity concentration of a p type is relatively high in comparison with p, and $p^-$ indicates that the impurity concentration of a p type is relatively low in comparison with p. An $n^+$ type and an $n^-$ type may be simply written as an n type, and a $p^+$ type and a $p^-$ type may be simply written as a p type.

First Embodiment

A semiconductor device according to a first embodiment includes a p-type SiC layer, a gate electrode, and a gate insulating layer provided between the SiC layer, and the gate electrode. The gate insulating layer includes a first layer, a second layer, a first region, and a second region. The second layer is provided between the first layer and the gate electrode and has a higher oxygen density than the first layer. The first region is provided across the first layer and the second layer. The first region includes a first element which is at least one element in the group consisting of F (fluorine), D (deuterium), and H (hydrogen) and has a first concentration peak of the first element. The second region is provided in the first layer. The second region includes a second element which is at least one element in the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) and has a second concentration peak of the second element and a third concentration peak of C (carbon) in which a distance from the second concentration peak is shorter than a distance from the first concentration peak.

FIG. 1 is a schematic sectional view illustrating a configuration of a MISFET which is a semiconductor device according to the present embodiment. A MISFET 100 is a double implantation MOSFET (DIMOSFET) in which a p-well and a source region are formed by ion implantation. Further, the MISFET 100 is an n-channel type MOSFET in which an electron is a carrier.

The MISFET 100 includes an $n^+$-type SiC substrate 12. In the present description, with respect to faces of the SiC substrate 12, a face on an upper side in FIG. 1 is called a front face, and a face on a lower side is called a back face.

The SiC substrate 12 is, for example, a SiC substrate of 4H—SiC, for example, including N (nitrogen), in which an impurity concentration is $1\times10^{18}$ cm$^{-3}$ or more and $1\times10^{20}$ cm$^{-3}$ or less, as n-type impurity.

Figure 2:
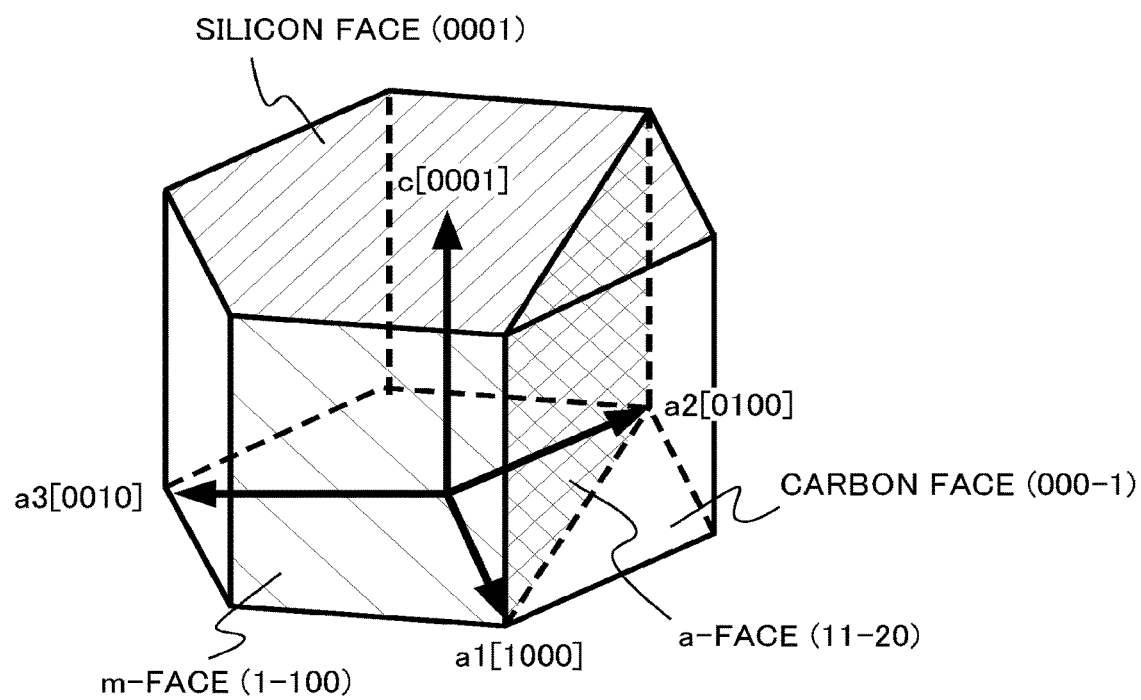
FIG. 2 illustrates a crystal structure of a SiC semiconductor according to the first embodiment.

FIG. 2 illustrates a crystal structure of a SiC semiconductor. A representative crystal structure of the SiC semiconductor is a hexagonal crystal system such as 4H—SiC. One side of faces (a top face of a hexagonal prism), in which a c-axis along an axial direction of the hexagonal prism is a normal line, is a (0001) face. A face equivalent to the (0001) face is called a silicon face and denoted as a {0001} face. Si (silicon) is arranged on the silicon face.

The other side of faces (a top face of a hexagonal prism), in which a c-axis along an axial direction of the hexagonal prism is a normal line, is a (000-1) face. A face equivalent to the (000-1) face is called a carbon face and denoted as a {000-1} face. C (carbon) is arranged on the carbon face.

On the other hand, a side surface (prism surface) of a hexagonal prism is an m-face equivalent to a (1-100) face, in other words, a {1-100} face. Further, a face passing through a pair of ridgelines which are not neighboring is an a-face equivalent to a (11-20) face, in other words, a {11-20} face. Both of Si (silicon) and C (carbon) are arranged on the m-face and the a-face.

Hereinafter, an example will be described in which a front face of the SiC substrate 12 is a face inclined at 0° or more and 8° or less with respect to a silicon face, and a back face is a face inclined at 0° or more and 8° or less with respect to a carbon face.

On the front face of the SiC substrate 12, for example, an $n^-$ type drift layer 14 is formed in which an impurity concentration of n-type impurity is $5\times10^{15}$ cm$^{-3}$ or more and $2\times10^{16}$ cm$^{-3}$ or less. The drift layer 14 is, for example, an epitaxial layer of SiC formed by epitaxial growing on the SiC substrate 12.

A front face of the drift layer 14 is a face inclined at 0° or more and 8° or less with respect to a silicon face. A film thickness of the drift layer 14 is, for example, 5 µm or more and 100 µm or less.

On a part of the front face of the drift layer 14, for example, a p-type p-well region (SiC layer) 16 is formed in which an impurity concentration of p-type impurity is $5\times10^{15}$ cm$^{-3}$ or more and $1\times10^{17}$ cm$^{-3}$ or less. A depth of the p-well region 16 is, for example, around 0.6 µm. The p-well region 16 functions as a channel region of the MISFET 100.

On a part of the front face of the p-well region 16, for example, an $n^+$-type source region 18 is formed in which an impurity concentration of n-type impurity is $1\times10^{18}$ cm$^{-3}$ or more and $1\times10^{22}$ cm$^{-3}$ or less. A depth of the source region 18 is shallower than a depth of the p-well region 16 and is, for example, around 0.3 µm.

Further, on a part of the front face of the p-well region 16 and on a side of the source region 18, for example, a p-well contact region 20 is formed in which an impurity concentration of p-type impurity is $1\times10^{18}$ cm$^{-3}$ or more and $1\times10^{22}$ cm$^{-3}$ or less. A depth of the p-well contact region 20 is shallower than a depth of the p-well region 16 and is, for example, around 0.3 µm.

A gate insulating layer 128 is provided continuously on the drift layer 14 and the p-well region (SiC layer) 16. The gate insulating layer is formed so as to extend over the drift layer 14 and the p-well region 16.

A gate electrode 30 is formed on the gate insulating layer 128. For example, doped polysilicon can be used for the gate electrode 30. On the gate electrode 30, for example, an interlayer insulating film 32 formed of a silicone oxide film is formed.

The p-well region 16 sandwiched between the source region 18 and the drift layer 14 under the gate electrode 30 functions as a channel region of the MISFET 100.

The gate insulating layer 128 is provided between the gate electrode 30 and the p-well region (SiC layer) 16. A film thickness of the gate insulating layer 128 is, for example, 30 nm or more and 300 nm or less. A film thickness of a silicone oxide film of the gate insulating layer 128 is, for example, 30 nm or more and 60 nm or less.

Figure 3A:
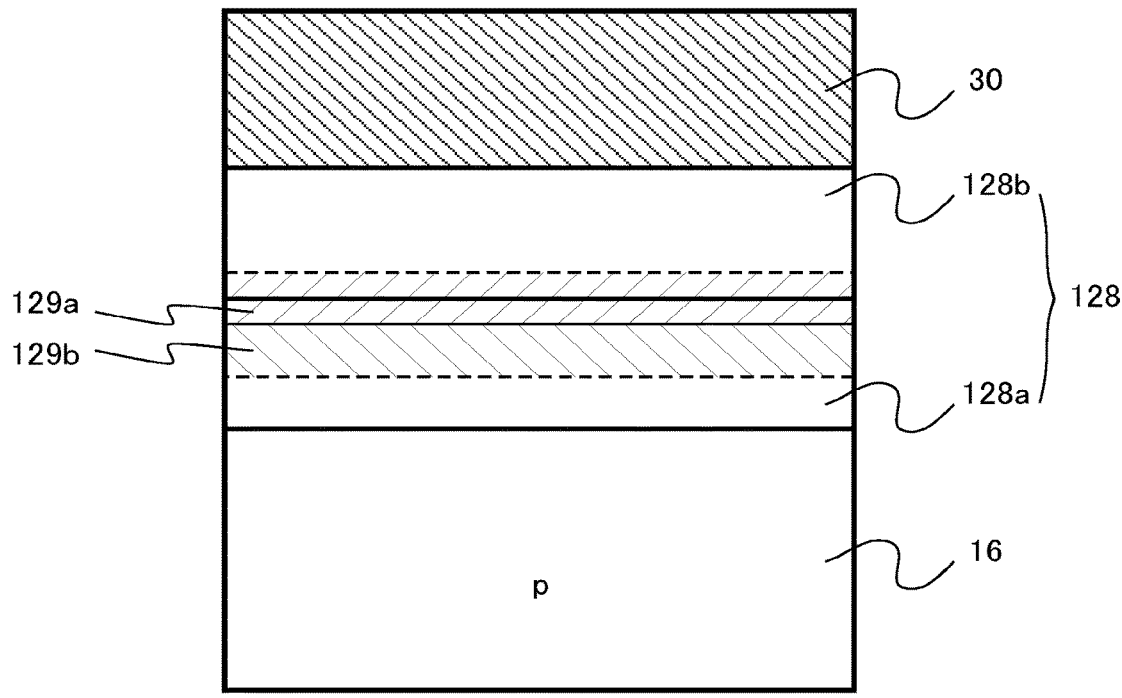
FIG. 3A is an enlarged view of a p-type SiC layer, a gate insulating layer, and a gate electrode according to the first embodiment.
Figure 3B:
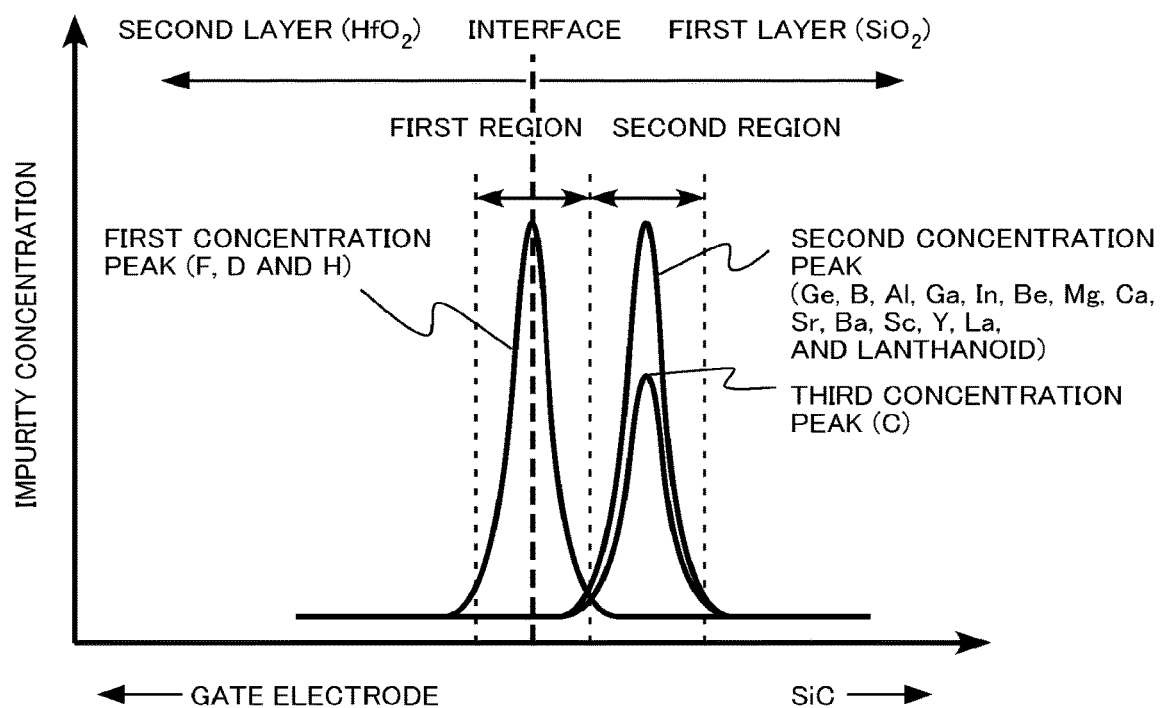
FIG. 3B illustrates element distribution of the SiC layer, the gate insulating layer, and the gate electrode.

FIG. 3A is an enlarged view of a p-type SiC layer, a gate insulating layer, and a gate electrode according to the present embodiment, and FIG. 3B illustrates element distribution of the SiC layer, the gate insulating layer, and the gate electrode. FIG. 3A is an enlarged view of a p-type SiC layer 16, a gate insulating layer 128, and a gate electrode 30, and FIG. 3B illustrates element distribution thereof.

The gate insulating layer 128 includes a first layer 128a, a second layer 128b, a first region 129a, and a second region 129b. The second layer 128b is provided between the first layer 128a and the gate electrode 30. The second layer 128b is provided on the first layer 128a.

The first layer 128a and the second layer 128b are, for example, an oxide film or an oxynitride film. The first layer 128a and the second layer 128b are, for example, a silicone oxide film, a silicon oxynitride film, a hafnium oxide film, a zirconium oxide film, and an aluminum oxide film.

An oxygen density of the second layer 128b is higher than an oxygen density of the first layer 128a. An example will be described in which the first layer 128a is a silicone oxide film, and the second layer 128b is a hafnium oxide film.

The first region 129a may be provided across the first layer 128a and the second layer 128b. The first region 129a may be provided between the first layer 128a and the second layer 128b. The first region 129a may be provided on an interface between the first layer 128a and the second layer 128b. The first region 129a includes a first element which is at least one element selected from the group consisting of F (fluorine), D (deuterium), and H (hydrogen).

The first region 129a has a first concentration peak of the first element. A full width at half maximum of the first concentration peak is equal to or less than 1 nm. The first element segregates on the interface between the first layer 128a and the second layer 128b. A concentration of the first element positioned 1 nm or more away from a concentration peak of the first element is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less).

The second region 129b may be provided in the first region 129a. The second region 129b may be provided between the first region 129a and the first layer 128a. The second region 129b includes a second element which is at least one element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu).

The second region 129b has a second concentration peak of a second element. A full width at half maximum of the second concentration peak is equal to or less than 1 nm. A concentration of the second element positioned 1 nm or more away from a concentration peak of the second element is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less). A distance of the second concentration peak from the first concentration peak is equal to or less than 4 nm. A distance of the second concentration peak from the first concentration peak is preferably equal to or less than 1 nm. The second element segregates on the first layer 128a side of an interface between the first layer 128a and the second layer 128b.

In the present description, a distance between peaks means a distance between tops of the peaks.

The second region 129b further has a third concentration peak of C (carbon). A full width at half maximum of the third concentration peak is equal to or less than 1 nm. A concentration of C positioned 1 nm or more away from a concentration peak of C is preferably sufficiently small and equal to or less than $1\times10^{18}$ cm$^{-3}$. A concentration of C can be confirmed by a SIMS and is preferably equal to or less than a detection limit of C (approximately $1\times10^{17}$ cm$^{-3}$ or less). A distance of a third concentration peak from the first concentration peak is equal to or less than 4 nm, and a distance from the second concentration peak is shorter than the distance from the first concentration peak. The third concentration peak and the second concentration peak preferably overlap. It is preferable that a top of the third concentration peak and a top of the second concentration peak are substantially in the same position.

Element concentrations and distribution thereof in the first layer 128a, the second layer 128b, the first region 129a, and the second region 129b can be calculated by, for example, a secondary ion mass spectrometry (SIMS).

The MISFET 100 includes a conductive source electrode 34 electrically connected to the source region 18 and the p-well contact region 20. The source electrode 34 also functions as a p-well electrode which applies a potential to the p-well region 16.

The source electrode 34 is formed by stacking of, for example, barrier metal layers of Ni (nickel) and metal layers of Al (aluminum) on the barrier metal layers. The barrier metal layers of Ni and the metal layers of Al may form an alloy by reaction.

Further, a conductive drain electrode 36 is formed on a side opposed to the drift layer 14 on the SiC substrate 12, specifically on a back surface side. The drain electrode 36 is, for example, Ni (nickel).

In the present embodiment, n-type impurity is preferably such as N (nitrogen) and P (phosphorus). However, As (arsenic) or Sb (antimony) can be applied. Further, p-type impurity is preferably such as Al (aluminum). However, such as B (boron), Ga (gallium), and In (indium) can be applied.

Functions and effects of a semiconductor device according to the present embodiment will be described below.

In a MISFET of SiC, mobility of an electron is decreased, and on-resistance is increased due to an interface state between a SiC layer and a gate insulating layer. Therefore, for example, there is a method in which N (nitrogen) or P (phosphorus) to terminate an interface state are introduced into the interface between a SiC layer and an insulating layer. In the case where this method is used, N (nitrogen) or P (phosphorus) function as n-type dopant, and a threshold voltage may be decreased in an n-channel type MISFET. Both a high mobility and a high threshold voltage are required in the n-channel type MISFET.

Figure 4:
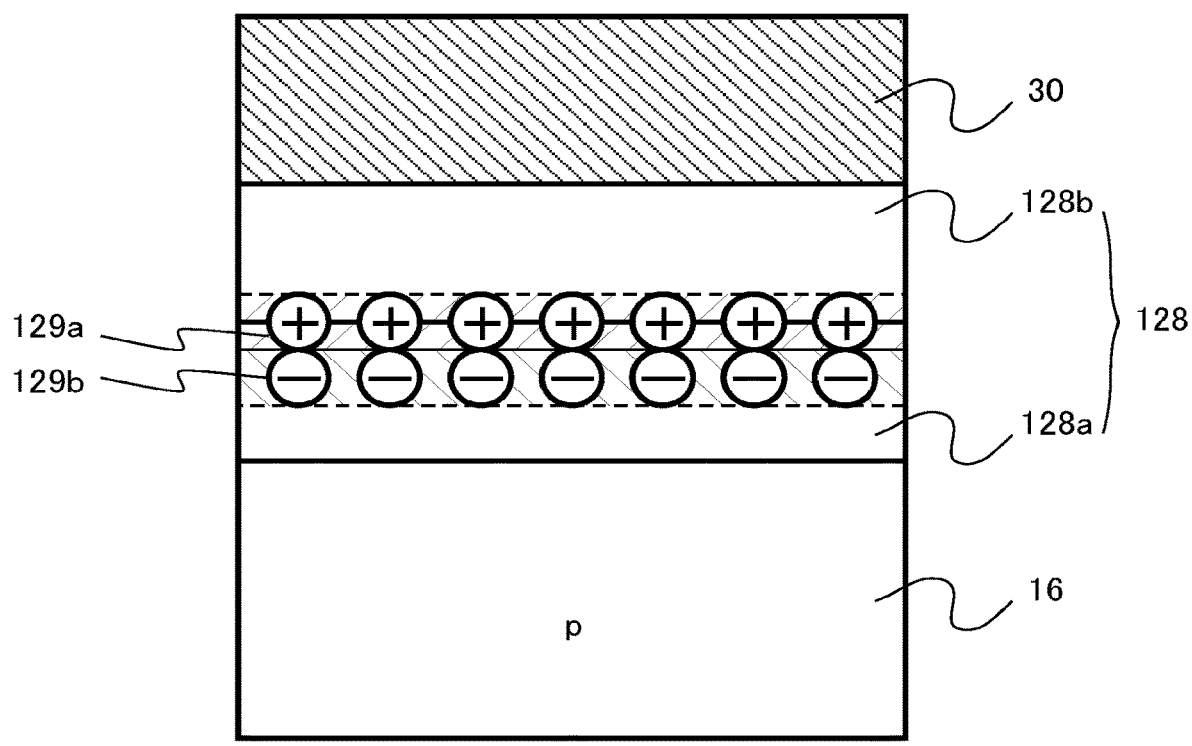
FIG. 4 is an explanatory diagram of functions and effects according to the first embodiment.

FIG. 4 is an explanatory diagram of functions and effects according to the present embodiment. In the present embodiment, a positive charge exists in the first region 129a, and a negative charge exists in the second region 129b neighboring the first region 129a. The positive charge and the negative charge form a fixed dipole. In the fixed dipole, a gate electrode side is a positive charge, and a SiC layer 16 side is a negative charge. Therefore, a threshold voltage of an n-channel type MISFET is increased by the fixed dipole. Accordingly, a MISFET having a high threshold voltage can be realized.

In the present embodiment, the gate insulating layer 128 has a stacked structure of the first layers 128a and the second layers 128b which have different oxygen densities. Oxygen defect density is increased on an interface between the first layer 128a and the second layer 128b which have different oxygen densities. As a result of a first principle calculation by an inventor of the present disclosure, in the case where a first element selected from F (fluorine), D (deuterium), and H (hydrogen) is introduced into an interface with an oxygen defect, an electron in the first element is discharged, the oxygen defect is buried by the first element, and the first element becomes a positive fixed charge. Accordingly, the interface is stabilized.

On the other hand, as a result of the first principle calculation by the inventor, it has been clarified that a second element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) is stabilized by forming a composite by combining with C (carbon) and O (oxygen) in an insulating layer, especially in a silicone oxide film. It has also been clarified that the composite forms an electron trap state in a silicone oxide film.

In the present embodiment, a fixed dipole is formed and stabilized when an electron is supplied from a first element selected from F (fluorine), D (deuterium), and H (hydrogen) to a second element and a composite of C (carbon) and O (oxygen).

A first concentration peak, a second concentration peak, and a third concentration peaks are preferably $1 \times 10^{19}$ cm$^{-3}$ or more and $4 \times 10^{22}$ cm$^{-3}$ or less. When the concentrations are below the above range, an increase effect of on a threshold voltage by a fixed dipole may not be obtained. Further, it is difficult to introduce an element over the above range into a film.

A second element forms a composite by combining with C (carbon) at a ratio of 1:1. Therefore, an amount ratio between the second element and C (carbon) is preferably close to 1:1. Therefore, a second concentration peak is preferably 80% or more and 120% or less of a third concentration peak.

The third concentration peak and the second concentration peak preferably overlap since a second element forms a composite by bonding with C (carbon).

Next, a manufacturing method for a semiconductor device according to the present embodiment will be described with reference to FIGS. 1 and 3. Especially, a manufacturing method for the gate insulating layer 128 will be described. An example will be described in which a first element is Al (aluminum), and a second element is F (fluorine).

First, a thermal oxide film is formed on the SiC layer 16. In such a case, C (carbon) in a substrate is diffused in the thermal oxide film. This thermal oxide film becomes the first layer 128a.

Next, a thermal nitriding process is performed in nitrogen oxide atmosphere, and a dangling bond on an interface between the SiC layer 16 and a thermal oxide film is terminated by N (nitrogen).

Next, Al (aluminum) film is vapor-deposited on a thermal oxide film. Then, fluorination is performed in fluorine plasma.

Next, a hafnium oxide film is deposited by a CVD method. The hafnium oxide film becomes the second layer 128b. Then, annealing is performed in nitrogen atmosphere. By annealing, F (fluorine) segregate to the interface between the first layer 128a and the second layer 128b, and also C (carbon) supplied from a substrate and Al supplied from an Al film and O (oxygen) combine, and a composite is formed. This composite is drawn to F (fluorine) on the interface, and the first region 129a and the second region 129b are formed.

Then, for example, a polycrystalline gate electrode is formed.

Regarding other process steps, the MISFET 100 illustrated in FIGS. 1 and 3 is formed by using a known manufacturing method.

According to the present embodiment, an n-channel type MISFET having both of a high mobility and a high threshold voltage can be realized.

As a method for introducing elements other than Al, as with Al, other metal may be vapor-deposited such as Ge (germanium), B (boron), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu). Alternatively, the MISFET is realized by using ion implantation. If the MISFET is realized by ion implantation, carbon can be introduced in the same region by carbon implantation. The above manufacturing methods can also applicable to embodiments to be described below. As a method for introducing elements other than F (fluorine), H plasma processing and D plasma processing may be performed to introduce D (deuterium) and H (hydrogen). The above manufacturing methods can also applicable to embodiments to be described below.

Second Embodiment

In a semiconductor device according to a second embodiment, a gate insulating layer is similar to the gate insulating layer according to the first embodiment other than that multiple layers of the stacked structure of first and second layers are introduced. Therefore, description of contents already described in the first embodiment will be omitted.

Figure 5:
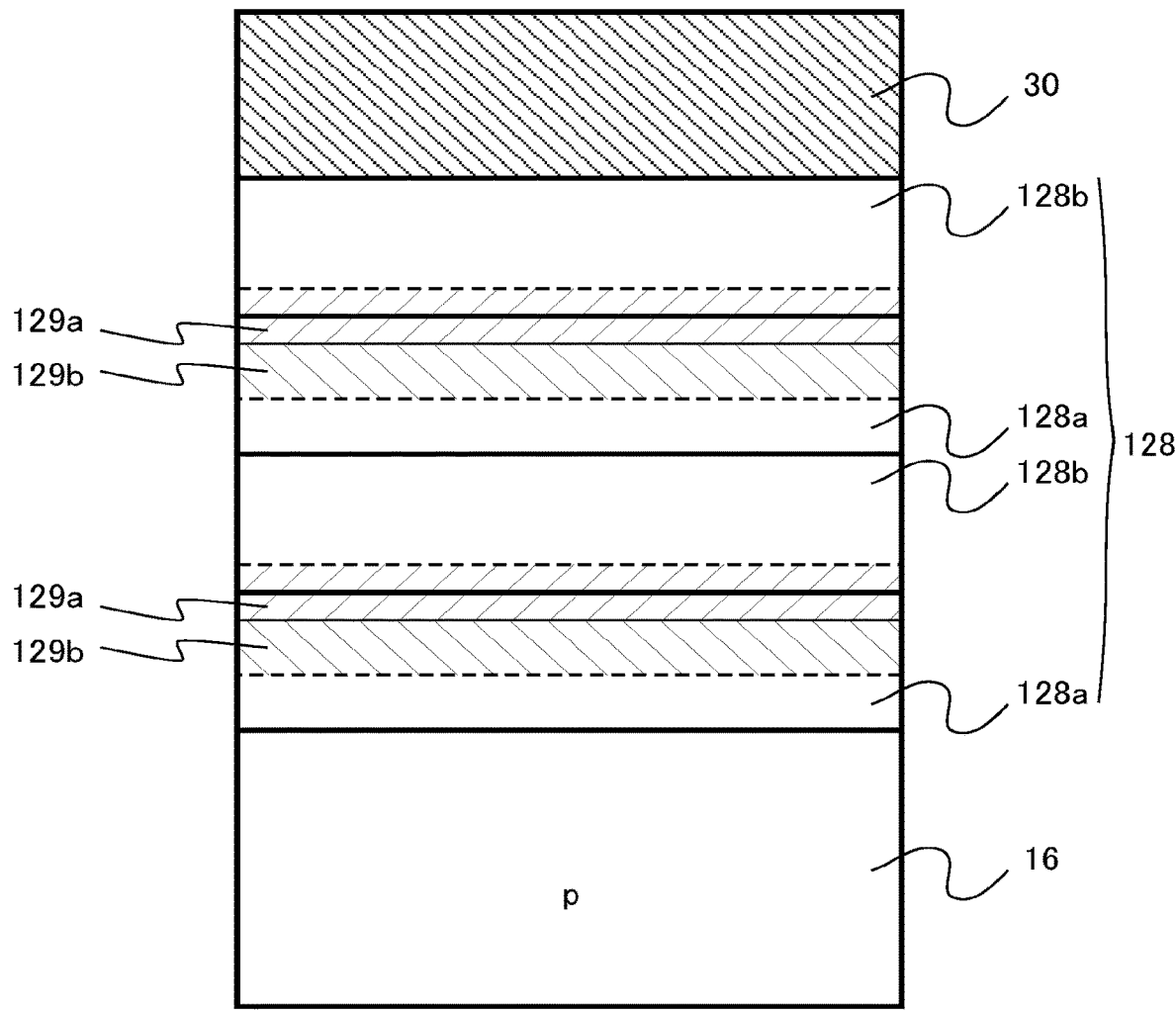
FIG. 5 is an enlarged view of a p-type SiC layer, a gate insulating layer, and a gate electrode according to a second embodiment.

FIG. 5 is an enlarged view of a p-type SiC layer, a gate insulating layer, and a gate electrode according to the present embodiment. As described in FIG. 5, a gate insulating layer 128 has a two-layer stacked structure of first layers 128a and second layers 128b. A first region 129a and a second region 129b include two layers.

Figure 6:
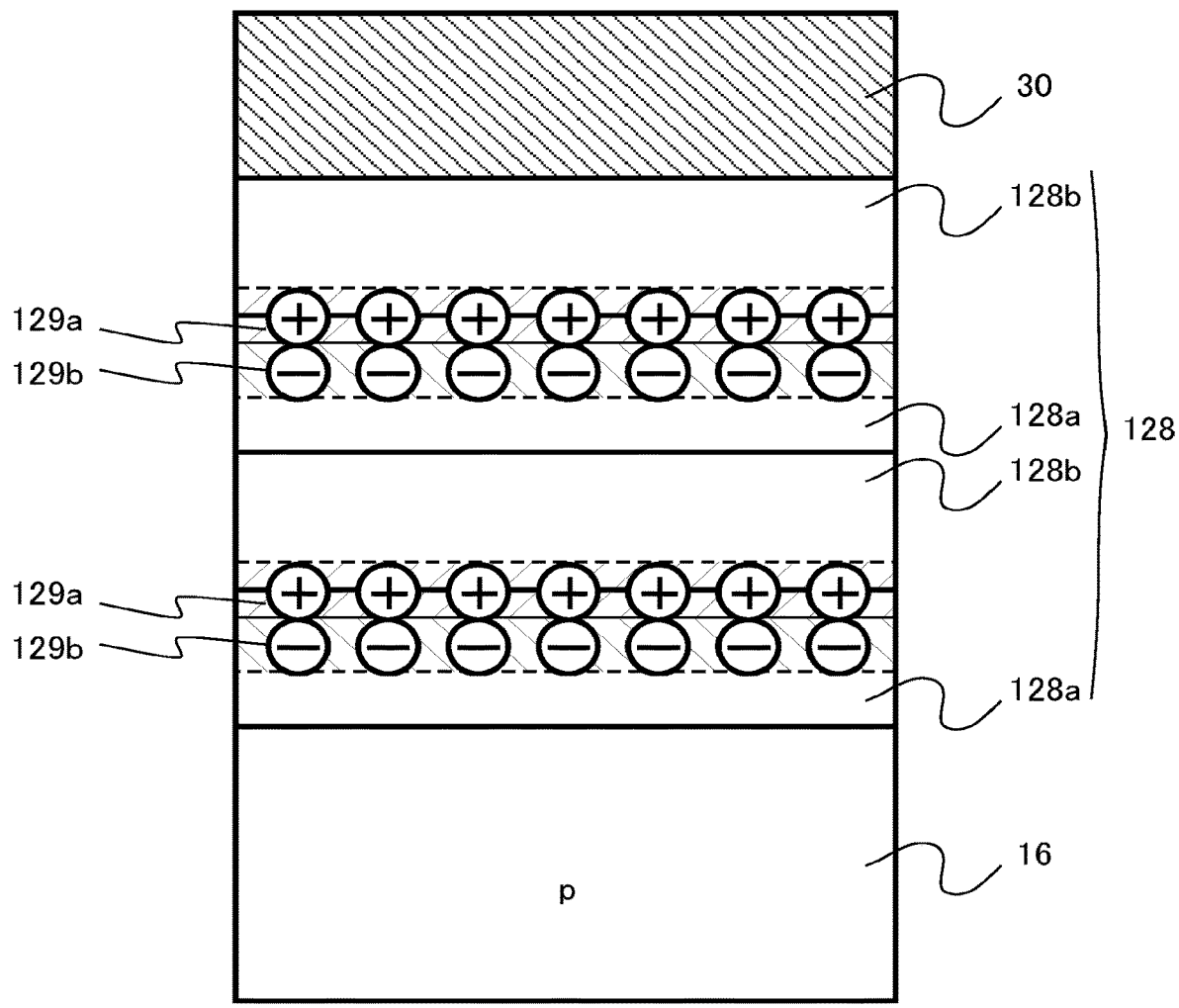
FIG. 6 is an explanatory diagram of functions and effects according to the second embodiment.

FIG. 6 is an explanatory diagram of functions and effects according to the present embodiment. In the present embodiment, a two-layer fixed dipole is formed by including two layers of the stacked structure of the first layers 128a and the second layers 128b and including two layers of the first region 129a and the second region 129b. Increase in a threshold voltage of a MISFET is proportional to numbers of the layers of the fixed dipole. Therefore, according to the present embodiment, a threshold voltage of the MISFET is further increased in comparison with the first embodiment.

Herein, the example has been described in which a two-layer stacked structure of the first layers 128a and the second layers 128b are introduced. However, the stacked structure can be three or more layers. Especially, a SiC-MISFET having a high breakdown voltage can have a thick gate insulating layer to a certain degree. Therefore, a threshold voltage can be easily increased by increasing numbers of the layers.

Carbon can be sufficiently taken in the second region 129b formed away from a substrate, for example, by using a film in which TEOS is used as a precursor. Other manufacturing methods are similar to the methods according to the first embodiment. In some cases, carbon may be introduced by ion implantation. In embodiments to be described later, a $SiO_2$ film deposited using TEOS can be applied when carbon is needed.

Third Embodiment

In a semiconductor device according to a third embodiment, a gate insulating layer includes a first layer, a second layer, a first region, and a second region. The second layer is provided between the first layer and a gate electrode and has a higher oxygen density than the first layer. The first region is provided in the second layer. The first region includes a first element which is at least one element in the group consisting of Ta (tantalum), Nb (niobium), and V (vanadium) and has a first concentration peak of the first element. The second region is provided in the first layer. The second region includes a second element which is at least one element selected from the group consisting of Ge (germanium), B (boron), Al (aluminum), Ga (gallium), In (indium), Be (beryllium), Mg (magnesium), Ca (calcium), Sr (strontium), Ba (barium), La (lantern), and lanthanoid (Ce, Pr, Nd, Pm, Sm, Eu, Gd, Tb, Dy, Ho, Er, Tm, Yb, and Lu) and has a second concentration peak of the second element and a third concentration peak of C (carbon) in which a distance from the second concentration peak is shorter than a distance from the first concentration peak. The semiconductor device according to the present embodiment is similar to the semiconductor device according to the first embodiment other than that a gate insulating layer has a different configuration. Therefore, description of contents already described in the first embodiment will be omitted.

Figure 7A:
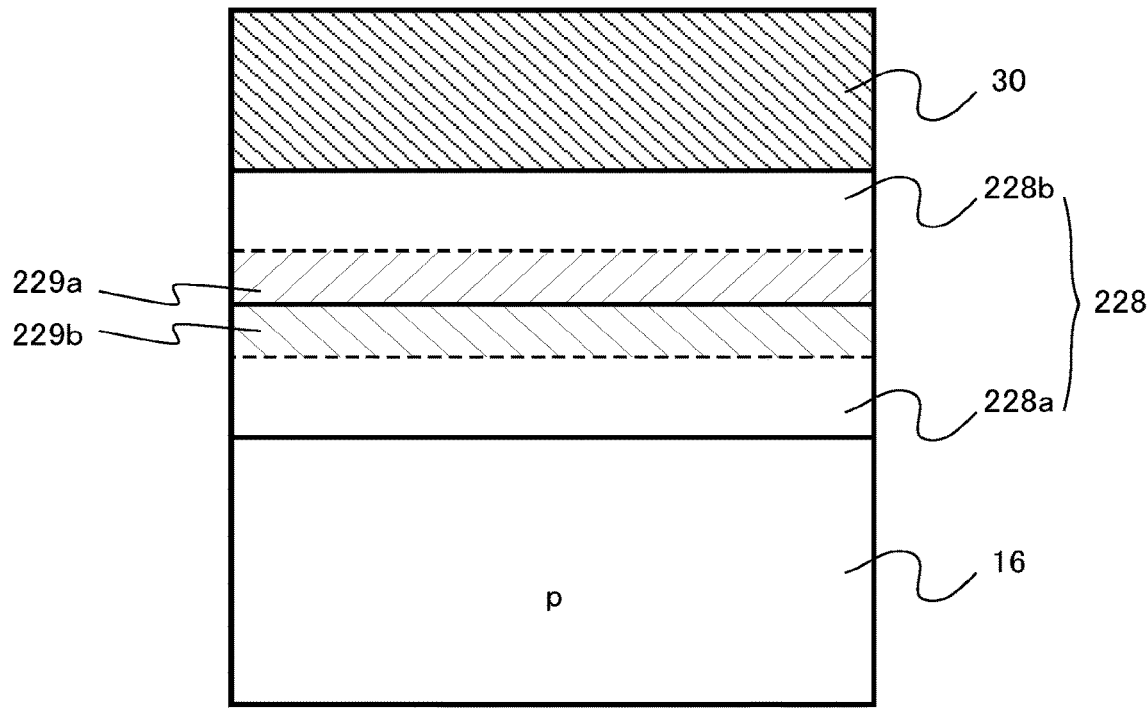
FIG. 7A is an enlarged view of a p-type SiC layer, a gate insulating layer, and a gate electrode according to a third embodiment.
Figure 7B:
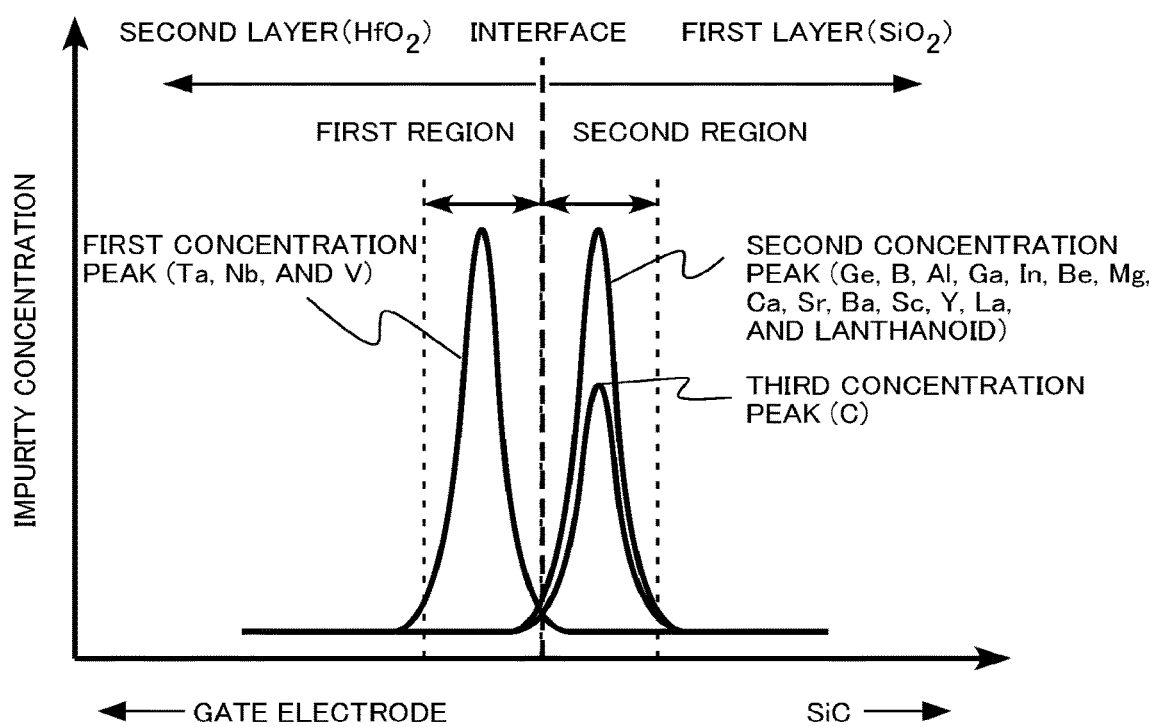
FIG. 7B illustrates element distribution of the SiC layer, the gate insulating layer, and the gate electrode.

FIG. 7A is an enlarged view of a p-type SiC layer, a gate insulating layer, and a gate electrode according to the present embodiment, and FIG. 7B illustrates element distribution of the SiC layer, the gate insulating layer, and the gate electrode. FIG. 7A is an enlarged view of a p-type SiC layer 16, a gate insulating layer 228, and a gate electrode 30, and FIG. 7B illustrates element distribution thereof.

The gate insulating layer 228 includes a first layer 228a, a second layer 228b, a first region 229a, and a second region 229b. The second layer 228b is provided between the first layer 228a and the gate electrode 30. The second layer 228b is provided on the first layer 228a.

The first layer 228a and the second layer 228b are, for example, an oxide film or an oxynitride film. The first layer 228a and the second layer 228b are, for example, a silicone oxide film, a silicon oxynitride film, a hafnium oxide film, a zirconium oxide film, and an aluminum oxide film.

An oxygen density in the second layer 228b is higher than an oxygen density in the first layer 228a. An example will be described in which the first layer 228a is a silicon oxide film, and the second layer 228b is a hafnium oxide film.

The first region 229a may be provided in the second layer 228b. The first region 229a may be provided between the first layer 228a and the second layer 228b. The first region 229a may be provided on the second layer 228b side on an interface between the first layer 228a and the second layer 228b. The first region 229a includes a first element which is at least one element selected from the group consisting of Ta (tantalum), Nb (niobium), and V (vanadium).

The first region has a first concentration peak of the first element. A full width at half maximum of the first concentration peak is equal to or less than 1 nm. The first element segregates on the interface between the first layer 228a and the second layer 228b. A concentration of the first element positioned 1 nm or more away from a concentration peak of the first element is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less).

The second region 229b may be provided in the first layer 228a. The second region 229b may be provided between the first region 229a and the first layer 228a. The second region 229b includes a second element which is at least one element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu).

The second region has a second concentration peak of the second element. A full width at half maximum of the second concentration peak is equal to or less than 1 nm. A concentration of the second element positioned 1 nm or more away from a concentration peak of the second element is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less). A distance of the second concentration peak from the first concentration peak is equal to or less than 4 nm. A distance of the second concentration peak from the first concentration peak is preferably equal to or less than 1 nm. The second element segregates on the first layer 228a side on the interface between the first layer 228a and the second layer 228b.

The second region 229b further has a third concentration peak of C (carbon). A full width at half maximum of the third concentration peak is equal to or less than 1 nm. A concentration of C positioned 1 nm or more away from a concentration peak of C is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less). A distance of a third concentration peak from the first concentration peak is equal to or less than 4 nm, and a distance from the second concentration peak is shorter than the distance from the first concentration peak. The third concentration peak and the second concentration peak preferably overlap. It is preferable that a top of the third concentration peak and a top of the second concentration peak are substantially in the same position.

Element concentrations and distribution thereof in the first layer 228a, the second layer 228b, the first region 229a, and the second region 229b can be calculated by, for example, a secondary ion mass spectrometry (SIMS).

Figure 8:
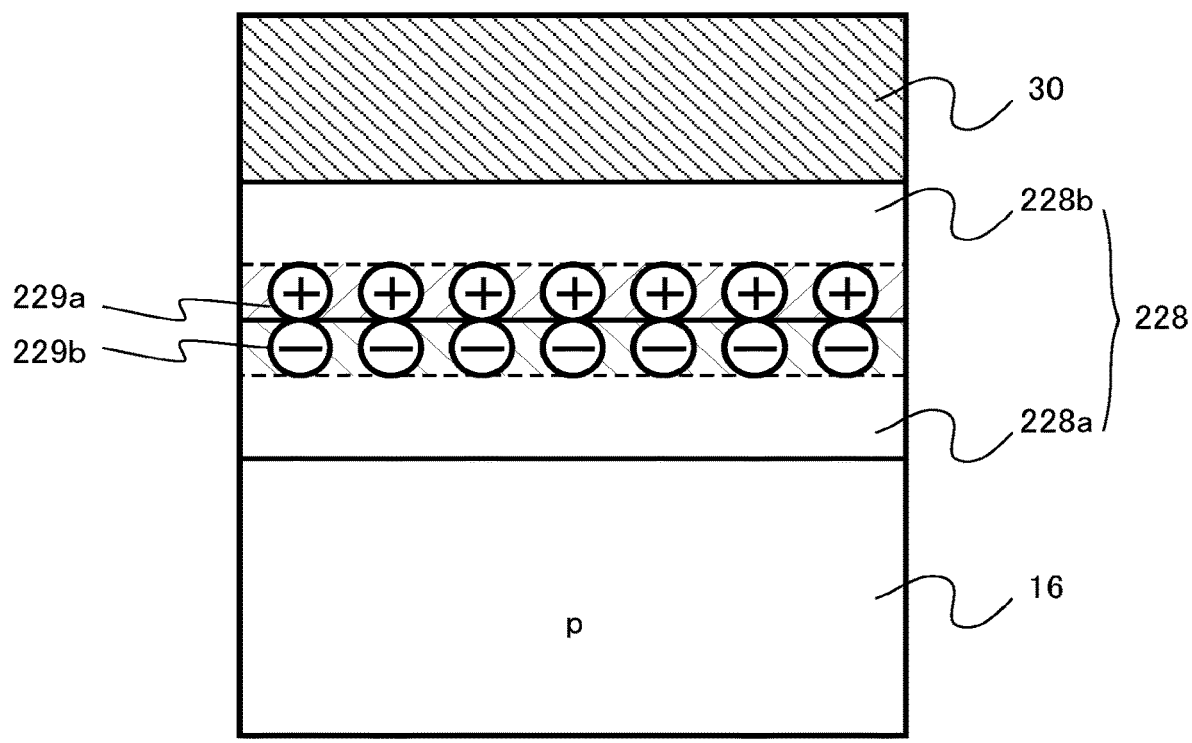
FIG. 8 is an explanatory diagram of functions and effects according to the third embodiment.

FIG. 8 is an explanatory diagram of functions and effects according to the present embodiment. In the present embodiment, a positive charge exists in the first region 229a, and a negative charge exists in the second region 229b neighboring the first region 229a. The positive charge and the negative charge form a fixed dipole. In the fixed dipole, a gate electrode side is a positive charge, and a SiC layer 16 side is a negative charge. Therefore, a threshold voltage of an n-channel type MISFET is increased by the fixed dipole. Accordingly, a MISFET having a high threshold voltage can be realized.

In the present embodiment, a first element selected from Ta (tantalum), Nb (niobium), and V (vanadium) is fixed in the second layer 228b having a high oxygen density. As a result of a first principle calculation by an inventor of the present disclosure, it has been clarified that the first element selected from Ta (tantalum), Nb (niobium), and V (vanadium) is stabilized by replacing a metal element in the second layer 228b with a high oxygen density by discharging an electron.

On the other hand, as a result of the first principle calculation by the inventor, it has been clarified that a second element selected from the group consisting of Ge (germanium), B (boron), Al (aluminum), Ga (gallium), In (indium), Be (beryllium), Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) is stabilized by forming a composite by combining C (carbon) and O (oxygen) in an insulating layer, especially in a silicone oxide film. It has also been clarified that the composite forms an electron trap state in a silicone oxide film.

In the present embodiment, a fixed dipole is formed and stabilized when an electron is supplied from a first element selected from Ta (tantalum), Nb (niobium), and V (vanadium) to a composite of a second element, C (carbon) and O (oxygen).

A first concentration peak, a second concentration peak, and a third concentration peak are preferably $1 \times 10^{19}$ cm$^{-3}$ or more and $4 \times 10^{22}$ cm$^{-3}$ or less. When the concentrations are below the above range, an increase effect on a threshold voltage by a fixed dipole may not be obtained. Further, it is difficult to introduce an element over the above range into a film.

According to the present embodiment, an n-channel type MISFET having both of a high mobility and a high threshold voltage can be realized.

As a method for introducing elements other than Ta, as with Ta, other metal may be vapor-deposited such as Nb (niobium) and V (vanadium). Alternatively, the MISFET is realized by using ion implantation. Further, in accordance with the second embodiment, a multi-stacked film may be used.

Fourth Embodiment

In a semiconductor device according to a fourth embodiment, a gate insulating layer includes a first layer, a second layer, a first region, and a second region. The second layer is provided between the first layer and an gate electrode and has a lower oxygen density than the first layer. The first region is provided across the first layer and the second layer. The first region includes a first element which is at least one element in the group consisting of N (nitrogen), P (phosphorus), As (arsenic), Sb (antimony), and Bi (bismuth) and has a first concentration peak of the first element. The second region is provided in the second layer. The second region includes a second element which is at least one element selected from the group consisting of N (nitrogen), P (phosphorus), As (arsenic), Sb (antimony), and Bi (bismuth) and has a second concentration peak of the second element and a third concentration peak of C (carbon) in which a distance from the second concentration peak is shorter than a distance from the first concentration peak.

The semiconductor device according to the present embodiment is similar to the semiconductor device according to the first embodiment other than that a gate insulating layer has a different configuration. Therefore, description of contents already described in the first embodiment will be omitted.

Figure 9A:
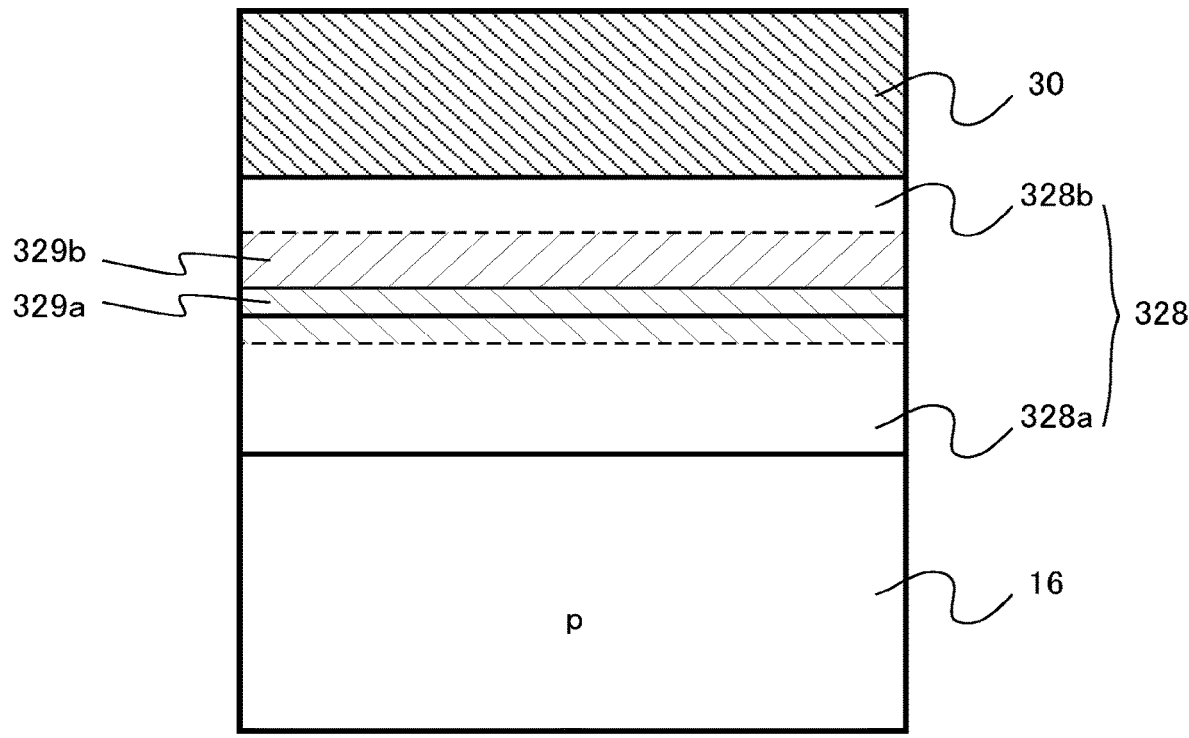
FIG. 9A is an enlarged view of a p-type SiC layer, a gate insulating layer, and a gate electrode according to a fourth embodiment.
Figure 9B:
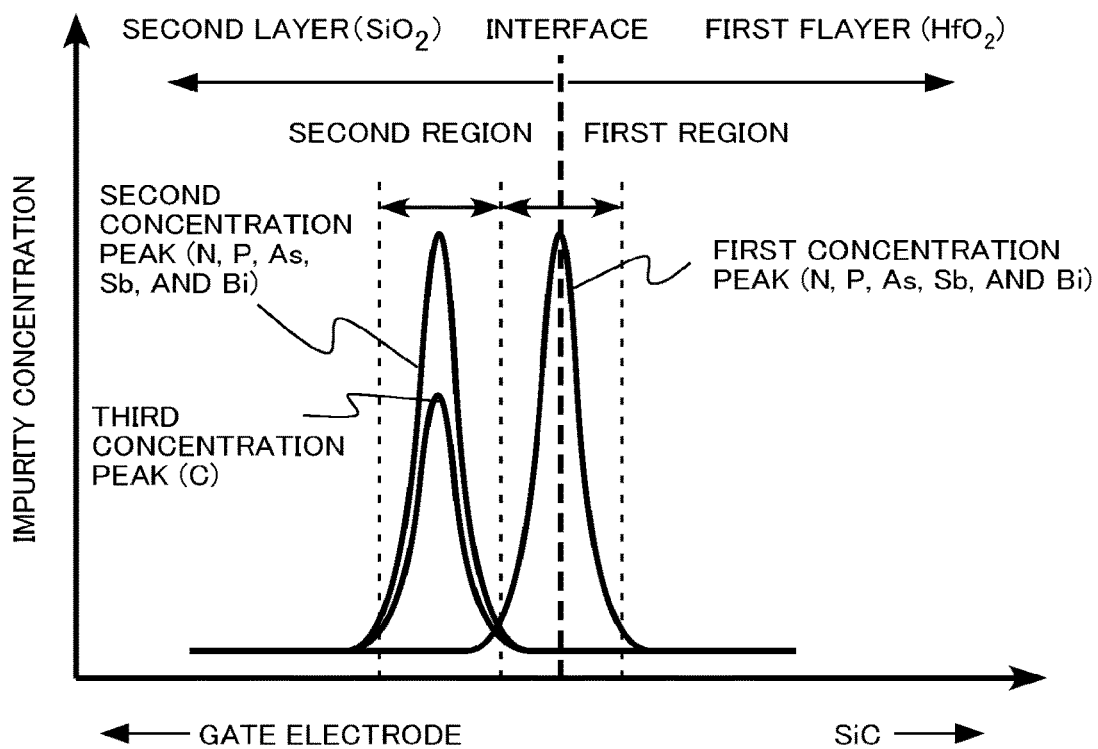
FIG. 9B illustrates element distribution of the SiC layer, the gate insulating layer, and the gate electrode.

FIG. 9A is an enlarged view of a p-type SiC layer, a gate insulating layer, and a gate electrode according to the present embodiment, and FIG. 9B illustrates element distribution of the SiC layer, the gate insulating layer, and the gate electrode. FIG. 9A is an enlarged view of a p-type SiC layer 16, a gate insulating layer 328, and a gate electrode 30, and FIG. 9B illustrates element distribution thereof.

The gate insulating layer 328 includes a first layer 328a, a second layer 328b, a first region 329a, and a second region 329b. The second layer 328b is provided between the first layer 328a and the gate electrode 30. The second layer 328b is provided on the first layer 328a.

The first layer 328a and the second layer 328b are, for example, an oxide film or an oxynitride film. The first layer 328a and the second layer 328b are, for example, a silicone oxide film, a silicon oxynitride film, a hafnium oxide film, a zirconium oxide film, and an aluminum oxide film.

An oxygen density of the second layer 328b is lower than an oxygen density of the first layer 328a. An example will be described in which the first layer 328a is a hafnium oxide film, and the second layer 328b is a silicon oxide film.

The first region 329a may be provided across the first layer 328a and the second layer 328b. The first region 329a may be provided between the first layer 328a and the second layer 328b. The first region 329a may be provided at an interface between the first layer 328a and the second layer 328b. The first region 329a includes a first element which is at least one element selected from the group consisting of N (nitrogen), P (phosphorus), As (arsenic), Sb (antimony), and Bi (bismuth).

The first region 329a has a first concentration peak of the first element. A full width at half maximum of the first concentration peak is equal to or less than 1 nm. A concentration of the first element positioned 1 nm or more away from a concentration peak of the first element is preferably sufficiently small and equal to or less than $1 \times 10^{18}$ cm$^{-3}$. The element concentration can be confirmed by a SIMS and is preferably equal to or less than a detection limit of each element (approximately $1 \times 10^{17}$ cm$^{-3}$ or less). The first element segregates on the interface between the first layer 328a and the second layer 328b.

The second region 329b may be provided in the second layer 328b. The second region 329b may be provided between the first region 329a and the second layer 328b. The second region 329b includes a second element which is at least one element selected from the group consisting of N (nitrogen), P (phosphorus), As (arsenic), Sb (antimony), and Bi (bismuth).

The second region 329b has a second concentration peak of the second element. A full width at half maximum of the second concentration peak is equal to or less than 1 nm. A concentration of the second element positioned 1 nm or more away from a concentration peak of the second element is preferably sufficiently small and equal to or less than $1 \times 10^{18}$ cm$^{-3}$. The element concentration can be confirmed by a SIMS and is preferably equal to or less than a detection limit of each element (approximately $1 \times 10^{17}$ cm$^{-3}$ or less). Adistance of the second concentration peak from the first concentration peak is equal to or less than 4 nm. A distance of the second concentration peak from the first concentration peak is preferably equal to or less than 1 nm. The second element segregates on the second layer 328b side on an interface between the first layer 328a and the second layer 328b.

The second region 329b further has a third concentration peak of C (carbon). A full width at half maximum of the third concentration peak is equal to or less than 1 nm. A concentration of C positioned 1 nm or more away from a concentration peak of C is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less). A distance of the third concentration peak from the first concentration peak is equal to or less than 4 nm, and a distance from the second concentration peak is shorter than the distance from the first concentration peak. The third concentration peak and the second concentration peak preferably overlap. It is preferable that a top of the third concentration peak and a top of the second concentration peak are substantially in the same position.

Element concentrations and distribution thereof in the first layer 328a, the second layer 328b, the first region 329a, and the second region 329b can be calculated by, for example, a secondary ion mass spectrometry (SIMS).

Figure 10:
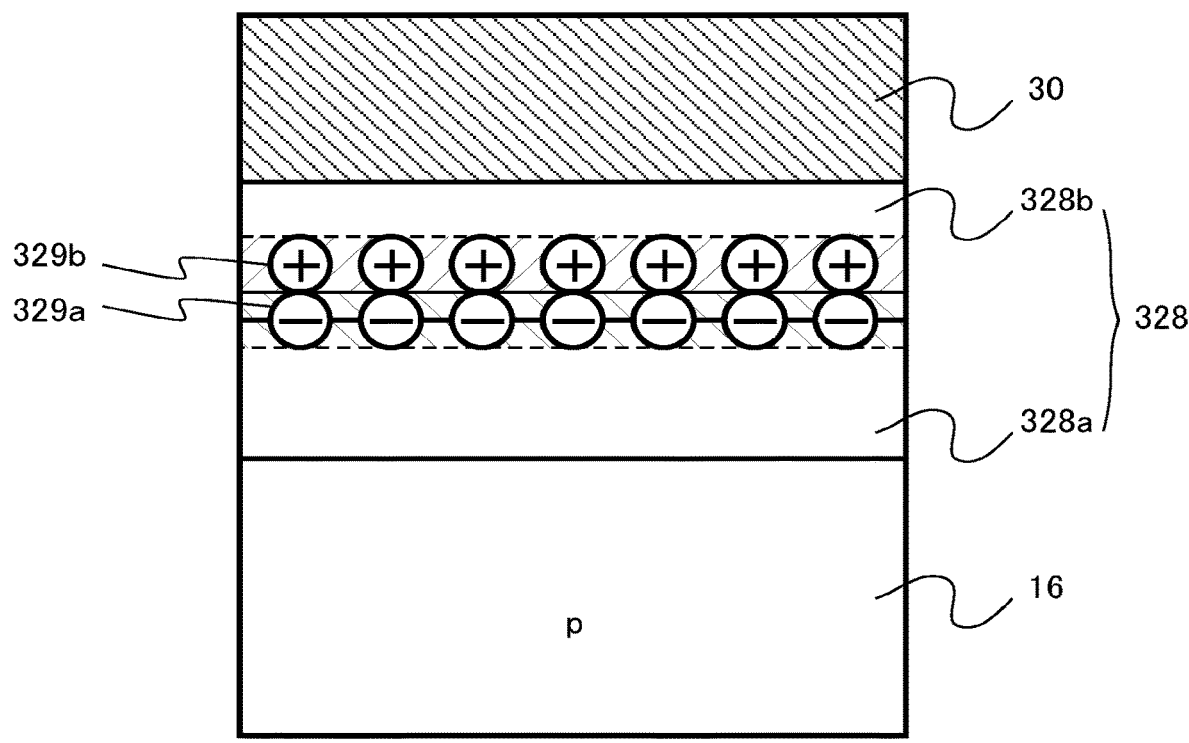
FIG. 10 is an explanatory diagram of functions and effects according to the fourth embodiment.

FIG. 10 is an explanatory diagram of functions and effects according to the present embodiment. In the present embodiment, a negative charge exists in the first region 329a, and a positive charge exists in the second region 329b neighboring the first region 329a. The positive charge and the negative charge form a fixed dipole. In the fixed dipole, a gate electrode side is a positive charge, and a SiC layer 16 side is a negative charge. Therefore, a threshold voltage of an n-channel type MISFET is increased by the fixed dipole. Accordingly, a MISFET having a high threshold voltage can be realized.

In the present embodiment, the gate insulating layer 328 has a stacked structure of the first layers 328a and the second layers 328b which have different oxygen densities. An oxygen defect density is increased at the interface between the first layer 328a and the second layer 328b which have different oxygen densities. As a result of a first principle calculation by an inventor of the present disclosure, it has been clarified that, when a first element selected from N (nitrogen), P (phosphorus), As (arsenic), Sb (antimony), and Bi (bismuth) is introduced to the interface, the first element receives an electron, the first element buries an oxygen defect, and the first element becomes a negative fixed charge. Accordingly, the interface is stabilized.

On the other hand, as a result of a first principle calculation by an inventor of the present disclosure, a second element selected from the group consisting of N (nitrogen), P (phosphorus), As (arsenic), Sb (antimony), and Bi (bismuth) is stabilized by forming a composite by combining with C (carbon) and O (oxygen) in an insulating layer, especially in a silicone oxide film. It has also been clarified that the composite discharges an electron and forms a positive charge in a silicone oxide film.

In the present embodiment, a stable fixed dipole is formed by supply of an electron from the composite of a second element, C (carbon) and O (oxygen) to a first element selected from N (nitrogen), P (phosphorus), As (arsenic), Sb (antimony), and Bi (bismuth).

A first concentration peak, a second concentration peak, and a third concentration peak are preferably $1\times10^{19}$ cm$^{-3}$ or more and $4\times10^{22}$ cm$^{-3}$ or less. When the concentrations are below the above range, an increase effect on a threshold voltage by a fixed dipole may not be obtained. Further, it is difficult to introduce an element over the above range into a film.

According to the present embodiment, an n-channel type MISFET having both of a high mobility and a high threshold voltage can be realized.

As a method for introducing N (nitrogen), P (phosphorus), As (arsenic), Sb (antimony), and Bi (bismuth), plasma processing may be performed in each element after an HfO$_2$ film is formed. Then, SiO$_2$, in which TEOS is used as a precursor, is formed thereon. Thus, a stacked film according to the embodiment is formed. Herein, instead of the plasma processing, elements such as N, P, As, Sb, and Bi may be adsorbed by performing NH$_3$, PH$_3$, AsH$_3$, SbH$_3$, and BiH$_3$ processing. Further, in accordance with the second embodiment, a multi-stacked film may be used.

Fifth Embodiment

In a semiconductor device according to a fifth embodiment, a gate insulating layer includes a first layer, a second layer, a first region, and a second region. The second layer is provided between the first layer and the gate electrode and has a higher oxygen density than the first layer. The first region is provided in the first layer. The first region includes a first element which is at least one element in the group consisting of Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) and has a first concentration peak of the first element. The second region is provided in the second layer. The second region includes a second element which is at least one element in the group consisting of N (nitrogen), P (phosphorus), As (arsenic), Sb (antimony), and Bi (bismuth) and has a second concentration peak of the second element and a third concentration peak of C (carbon) in which a distance from the second concentration peak is shorter than a distance from the first concentration peak.

The semiconductor device according to the present embodiment is similar to the semiconductor device according to the first embodiment other than that a gate insulating layer has a different configuration. Therefore, description of contents already described in the first embodiment will be omitted.

Figure 11A:
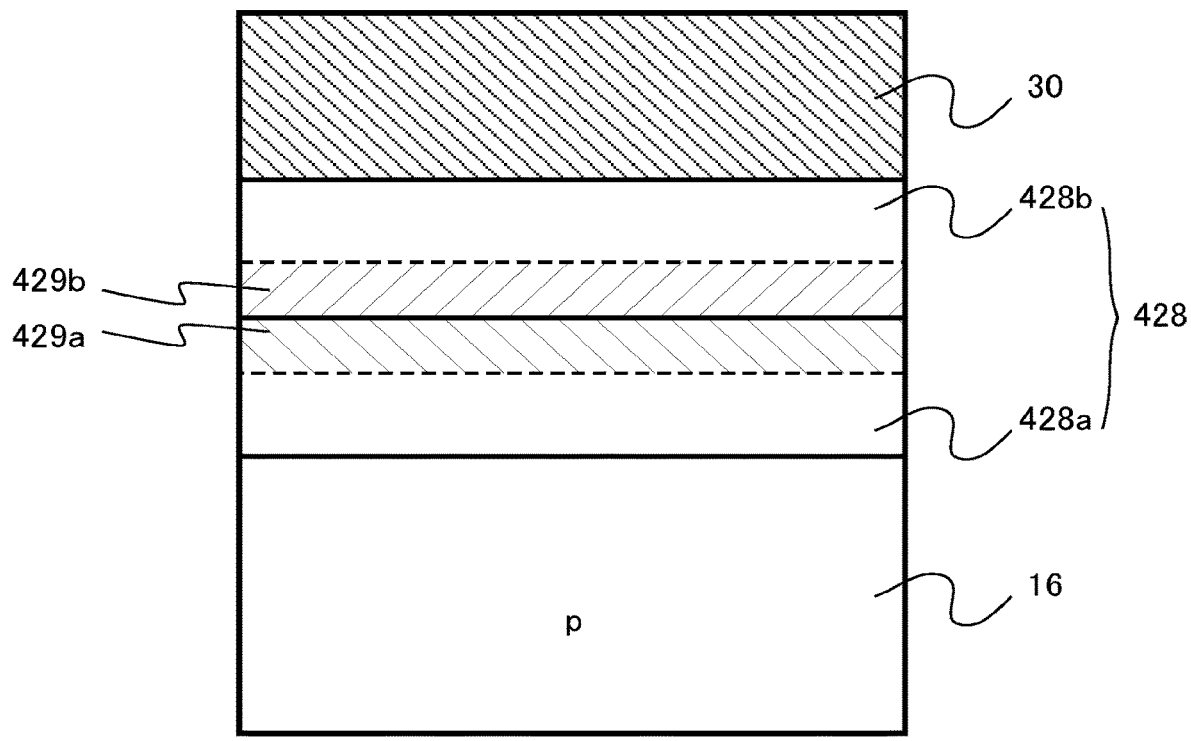
FIG. 11A is an enlarged view of a p-type SiC layer, a gate insulating layer, and a gate electrode according to a fifth embodiment.
Figure 11B:
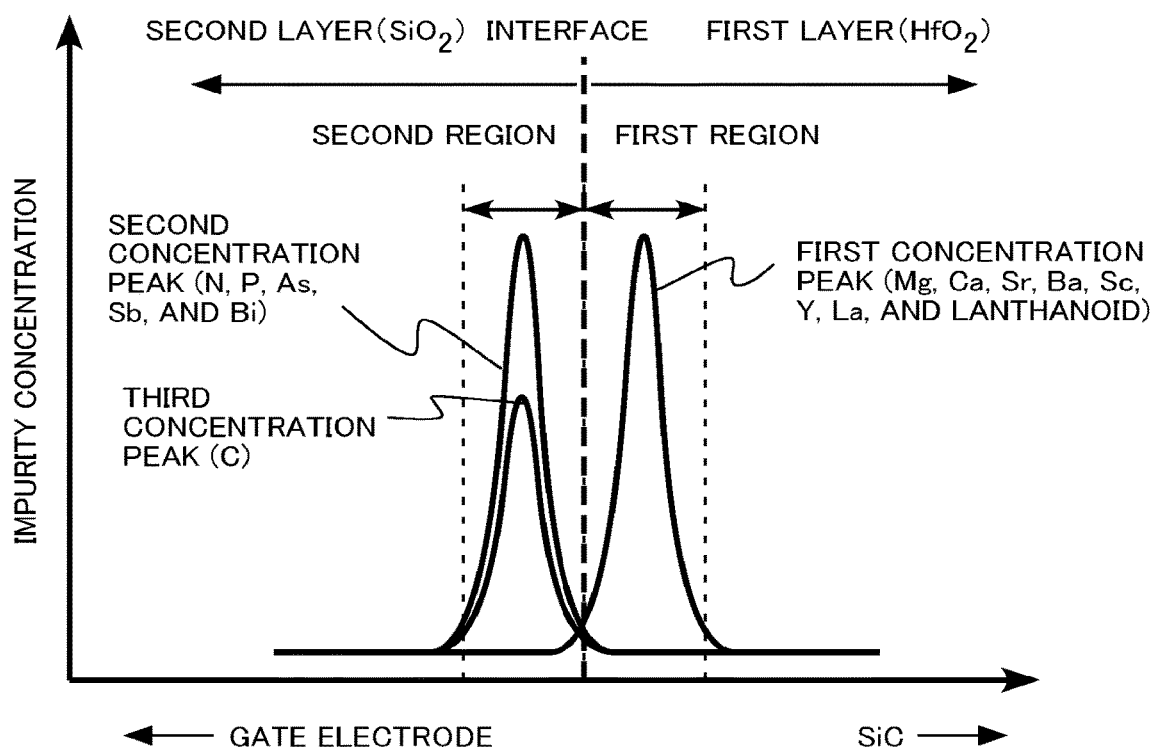
FIG. 11B illustrates element distribution of the SiC layer, the gate insulating layer, and the gate electrode.

FIG. 11A is an enlarged view of a p-type SiC layer, a gate insulating layer, and a gate electrode according to the present embodiment, and FIG. 11B illustrates element distribution of the SiC layer, the gate insulating layer, and the gate electrode. FIG. 11A is an enlarged view of a p-type SiC layer 16, a gate insulating layer 428, and a gate electrode 30, and FIG. 11B illustrates element distribution thereof.

A gate insulating layer 428 includes a first layer 428a, a second layer 428b, a first region 429a, and a second region 429b. The second layer 428b is provided between the first layer 428a and the gate electrode 30. The second layer 428b is provided on the first layer 428a.

The first layer 428a and the second layer 428b are, for example, an oxide film or an oxynitride film. The first layer 428a and the second layer 428b are, for example, a silicone oxide film, a silicon oxynitride film, a hafnium oxide film, a zirconium oxide film, and an aluminum oxide film.

An oxygen density of the second layer 428b is lower than an oxygen density of the first layer 428a. An example will be described in which the first layer 428a is a hafnium oxide film, and the second layer 428b is a silicon oxide film.

The first region 429a may be provided in the first layer 428a. The first region 429a may be provided between the first layer 428a and the second layer 428b. The first region 429a may be provided on the first layer 428a side on an interface between the first layer 428a and the second layer 428b. The first region 429a includes a first element which is at least one element selected from the group consisting of Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu).

The first region 429a has a first concentration peak of the first element. A full width at half maximum of the first concentration peak is equal to or less than 1 nm. The first element segregates on the first layer 428a side on an interface between the first layer 428a and the second layer 428b. A concentration of the first element positioned 1 nm or more away from a concentration peak of the first element is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less).

The second region 429b may be provided in the second layer 428b. The second region 429b may be provided between the first region 429a and the second layer 428b. The second region 429b includes a second element which is at least one element selected from the group consisting of N (nitrogen), P (phosphorus), As (arsenic), Sb (antimony), and Bi (bismuth).

The second region 429b has a second concentration peak of the second element. A full width at half maximum of the second concentration peak is equal to or less than 1 nm. A concentration of the second element positioned 1 nm or more away from a concentration peak of the second element is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less). A distance of the second concentration peak from the first concentration peak is equal to or less than 4 nm. A distance of the second concentration peak from the first concentration peak is preferably equal to or less than 1 nm. The second element segregates at the second layer 428b side on an interface between the first layer 428a and the second layer 428b.

The second region 429b further has a third concentration peak of C (carbon). A full width at half maximum of the third concentration peak is equal to or less than 1 nm. A concentration of C positioned 1 nm or more away from a concentration peak of C is preferably sufficiently small and equal to or less than $1\times10^{18}$ cm$^{-3}$. The element concentration can be confirmed by a SIMS and is preferably equal to or less than a detection limit of each element (approximately $1\times10^{17}$ cm$^{-3}$ or less). A distance of a third concentration peak from the first concentration peak is equal to or less than 4 nm, and a distance from the second concentration peak is shorter than the distance from the first concentration peak. The third concentration peak and the second concentration peak preferably overlap. It is preferable that a top of the third concentration peak and a top of the second concentration peak are substantially in the same position.

Element concentrations and distribution thereof in the first layer 428a, the second layer 428b, the first region 429a, and the second region 429b can be calculated by, for example, a secondary ion mass spectrometry (SIMS).

Figure 12:
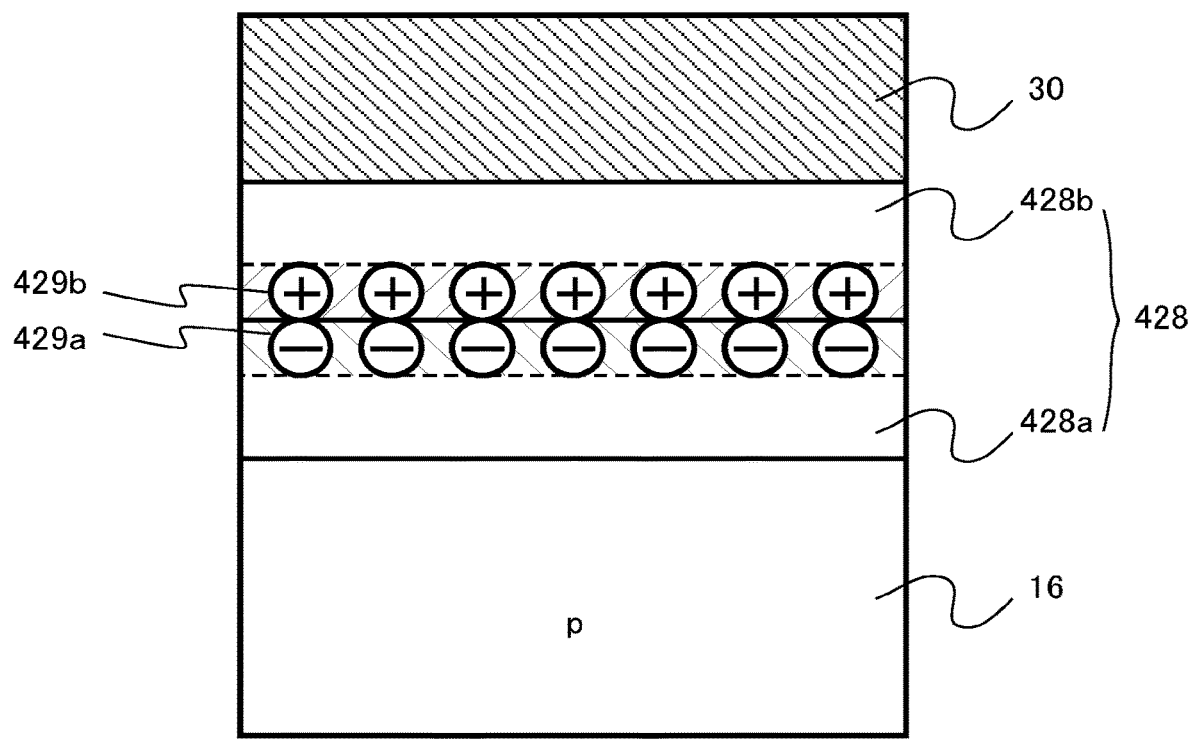
FIG. 12 is an explanatory diagram of functions and effects according to the fifth embodiment.

FIG. 12 is an explanatory diagram of functions and effects according to the present embodiment. In the present embodiment, a negative charge exists in the first region 429a, and a positive charge exists in the second region 429b neighboring the first region 429a. The positive charge and the negative charge form a fixed dipole. In the fixed dipole, a gate electrode side is a positive charge, and a SiC layer 16 side is a negative charge. Therefore, a threshold voltage of an n-channel type MISFET is increased by the fixed dipole. Accordingly, a MISFET having a high threshold voltage can be realized.

In the present embodiment, a first element selected from Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) is fixed in the second layer 328b having a high oxygen density, and forms a negative charge.

On the other hand, as a result of a first principle calculation by an inventor of the present disclosure, a second element selected from the group consisting of N (nitrogen), P (phosphorus), As (arsenic), Sb (antimony), and Bi (bismuth) is stabilized by forming a composite by combining with C (carbon) and O (oxygen) in an insulating layer, especially in a silicone oxide film. It has also been clarified that a positive charge is formed by discharging an electron in a silicone oxide film.

In the present embodiment, a fixed dipole is formed in which a negative charge of a first element selected from Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) and positive charges of the composite of a second element, C (carbon) and O (oxygen) are stabilized.

A first concentration peak, a second concentration peak, and a third concentration peak are preferably $1\times10^{19}$ cm$^{-3}$ or more and $4\times10^{22}$ cm$^{-3}$ or less. When the concentrations are below the above range, an increase effect on a threshold voltage by a fixed dipole may not be obtained. Further, it is difficult to introduce an element over the above range into a film.

According to the present embodiment, an n-channel type MISFET having both of a high mobility and a high threshold voltage can be realized.

As a method for introducing Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu), metal of each element may be vapor-deposited after an HfO$_2$ film is formed. Then, plasma processing is performed in N (nitrogen), P (phosphorus), As (arsenic), Sb (antimony), and Bi (bismuth), and SiO$_2$ in which TEOS is used as a precursor is formed. Thus, a stacked film according to the embodiment is formed. Herein, instead of the plasma processing, elements such as N, P, As, Sb, and Bi may be adsorbed by performing NH$_3$, PH$_3$, AsH$_3$, SbH$_3$, and BiH$_3$ processing. Further, in accordance with the second embodiment, a multi-stacked film may be used.

Sixth Embodiment

In a semiconductor device according to a sixth embodiment, a gate insulating layer includes a first layer, a second layer, a first region, and a second region. The second layer is provided between the first layer and a gate electrode and has a higher oxygen density than the first layer. The first region is provided across the first layer and the second layer. The first region includes a first element which is at least one element in the group consisting of N (nitrogen), P (phosphorus), As (arsenic), Sb (antimony), and Bi (bismuth) and has a first concentration peak of the first element. The second region is provided in the second layer. The second region includes a second element which is at least one element in the group consisting of Ta (tantalum), Nb (niobium), and V (vanadium) and has a second concentration peak of the second element. The semiconductor device according to the present embodiment is similar to the semiconductor device according to the first embodiment other than that a gate insulating layer has a different configuration. Therefore, description of contents already described in the first embodiment will be omitted.

Figure 13A:
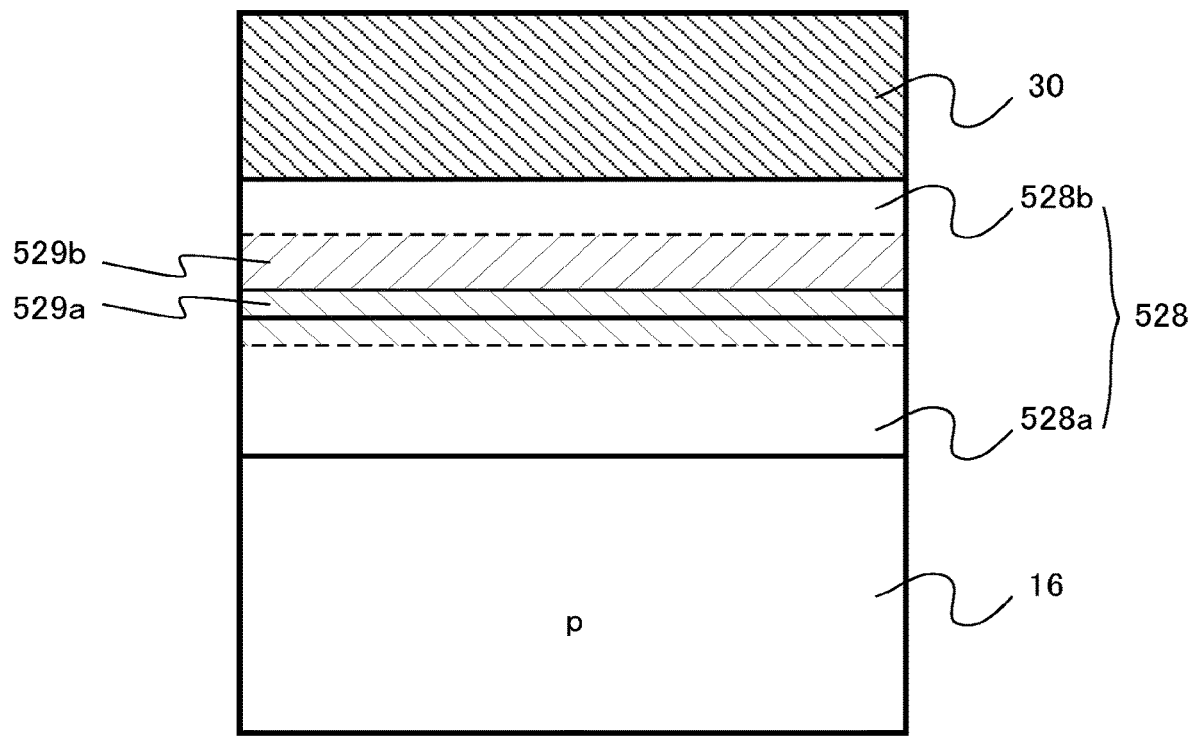
FIG. 13A is an enlarged view of a p-type SiC layer, a gate insulating layer, and a gate electrode according to a sixth embodiment.
Figure 13B:
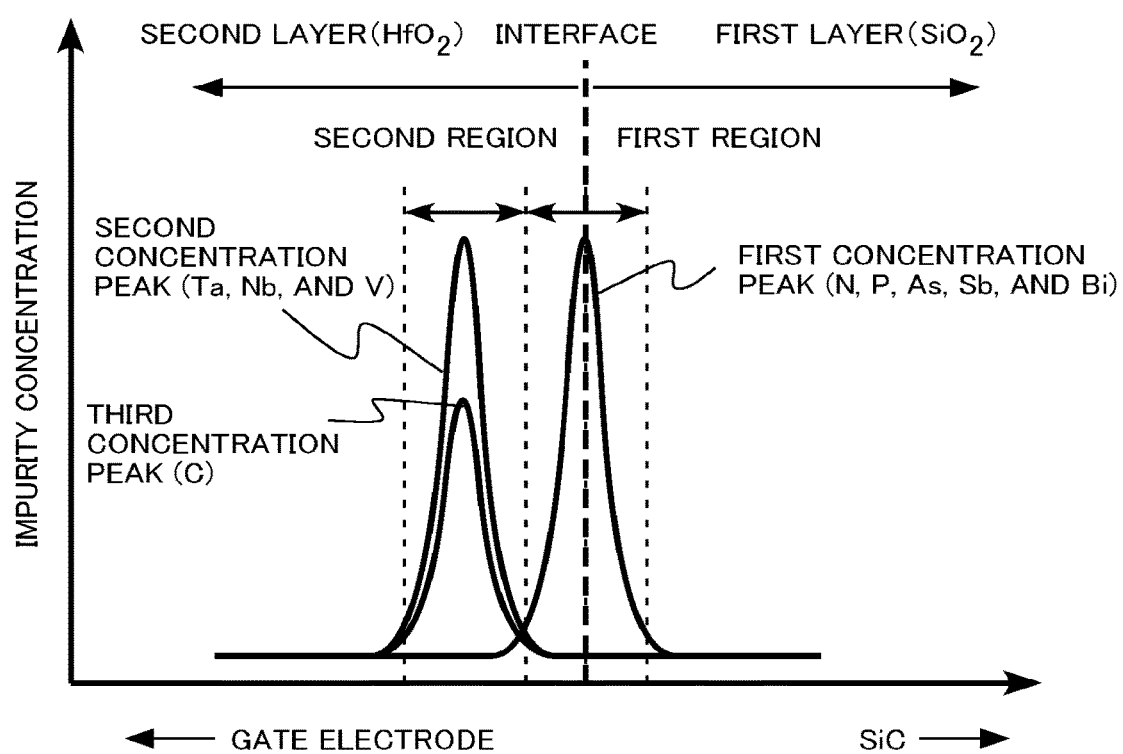
FIG. 13B illustrates element distribution of the SiC layer, the gate insulating layer, and the gate electrode.

FIG. 13A is an enlarged view of a p-type SiC layer, a gate insulating layer, and a gate electrode according to the present embodiment, and FIG. 13B illustrates element distribution of the SiC layer, the gate insulating layer, and the gate electrode. FIG. 13A is an enlarged view of a p-type SiC layer 16, a gate insulating layer 528, and a gate electrode 30, and FIG. 13B illustrates element distribution thereof.

Agate insulating layer 528 includes a first layer 528a, a second layer 528b, a first region 529a, and a second region 529b. The second layer 528b is provided between the first layer 528a and the gate electrode 30. The second layer 528b is provided on the first layer 528a.

The first layer 528a and the second layer 528b are, for example, an oxide film or an oxynitride film. The first layer 528a and the second layer 528b are, for example, a silicone oxide film, a silicon oxynitride film, a hafnium oxide film, a zirconium oxide film, and an aluminum oxide film.

An oxygen density in the second layer 528b is higher than an oxygen density in the first layer 528a. An example will be described in which the first layer 528a is a silicon oxide film, and the second layer 528b is a hafnium oxide film.

The first region 529a may be provided across the first layer 528a and the second layer 528b. The first region 529a may be provided between the first layer 528a and the second layer 528b. The first region 529a may be provided at an interface between the first layer 528a and the second layer 528b. The first region 529a includes a first element which is at least one element selected from the group consisting of N (nitrogen), P (phosphorus), As (arsenic), Sb (antimony), and Bi (bismuth).

The first region 529a has a first concentration peak of the first element. A full width at half maximum of the first concentration peak is equal to or less than 1 nm. The first element segregates at the interface between the first layer 528a and the second layer 528b. A concentration of the first element positioned 1 nm or more away from a concentration peak of the first element is preferably sufficiently small and equal to or less than $1 \times 10^{18}$ cm$^{-3}$. The element concentration can be confirmed by a SIMS and is preferably equal to or less than a detection limit of each element (approximately $1 \times 10^{17}$ cm$^{-3}$ or less).

The second region 529b may be provided in the second layer 528b. The second region 529b may be provided between the first region 529a and the second layer 528b. The second region 529b includes a second element which is at least one element selected from the group consisting of Ta (tantalum), Nb (niobium), and V (vanadium).

The second region 529b has a second concentration peak of the second element. A full width at half maximum of the second concentration peak is equal to or less than 1 nm. A concentration of the second element positioned 1 nm or more away from a concentration peak of the second element is preferably sufficiently small and equal to or less than $1 \times 10^{18}$ cm$^{-3}$. The element concentration can be confirmed by a SIMS and is preferably equal to or less than a detection limit of each element (approximately $1 \times 10^{17}$ cm$^{-3}$ or less). A distance of the second concentration peak from the first concentration peak is equal to or less than 4 nm. A distance of the second concentration peak from the first concentration peak is preferably equal to or less than 1 nm. The second element segregates on the second layer 528b side on an interface between the first layer 528a and the second layer 528b.

The second region 529b preferably further has a third concentration peak of C (carbon). A full width at half maximum of the third concentration peak is equal to or less than 1 nm. A concentration of C positioned 1 nm or more away from a concentration peak of C is preferably sufficiently small and equal to or less than $1 \times 10^{18}$ cm$^{-3}$. The element concentration can be confirmed by a SIMS and is preferably equal to or less than a detection limit of each element (approximately $1 \times 10^{17}$ cm$^{-3}$ or less). A distance of a third concentration peak from the first concentration peak is equal to or less than 4 nm, and a distance from the second concentration peak is shorter than the distance from the first concentration peak. The third concentration peak and the second concentration peak preferably overlap. It is preferable that a top of the third concentration peak and a top of the second concentration peak are substantially in the same position.

Element concentrations and distribution thereof in the first layer 528a, the second layer 528b, the first region 529a, and the second region 529b can be calculated by, for example, a secondary ion mass spectrometry (SIMS).

Figure 14:
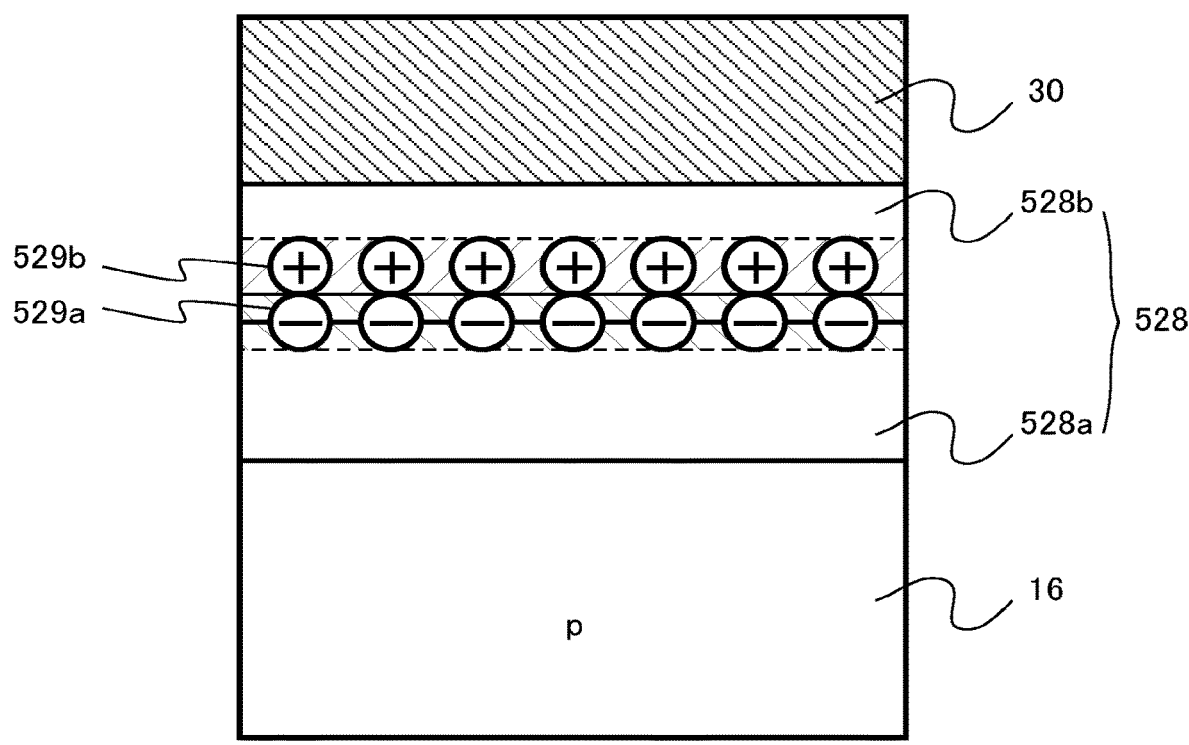
FIG. 14 is an explanatory diagram of functions and effects according to the sixth embodiment.

FIG. 14 is an explanatory diagram of functions and effects according to the present embodiment. In the present embodiment, a negative charge exists in the first region 529a, and a positive charge exists in the second region 529b neighboring the first region 529a. The positive charge and the negative charge form a fixed dipole. In the fixed dipole, a gate electrode side is a positive charge, and a SiC layer 16 side is a negative charge. Therefore, a threshold voltage of an n-channel type MISFET is increased by the fixed dipole. Accordingly, a MISFET having a high threshold voltage can be realized.

In the present embodiment, the gate insulating layer 528 has a stacked structure of the first layers 528a and the second layers 528b which have different oxygen densities. An oxygen defect density is increased on the interface between the first layer 528a and the second layer 528b which have different oxygen densities. As a result of a first principle calculation by an inventor of the present disclosure, it has been clarified that, when a first element selected from N (nitrogen), P (phosphorus), As (arsenic), Sb (antimony), and Bi (bismuth) is introduced to the interface, the first element receives an electron, the first element buries an oxygen defect, and the first element becomes a negative fixed charge. Accordingly the first element is stabilized.

In the present embodiment, a second element selected from Ta (tantalum), Nb (niobium), and V (vanadium) is fixed in the second layer 528b which has a high oxygen density, and a positive electrical charge is formed. The second element is stabilized by coexisting with C (carbon).

Therefore, in the present embodiment, an electron is supplied from a second element selected from Ta (tantalum), Nb (niobium), and V (vanadium) to a first element selected from N (nitrogen), P (phosphorus), As (arsenic), Sb (antimony), and Bi (bismuth) on an interface. Accordingly, a fixed dipole is formed, and the interface is stabilized.

A first concentration peak, a second concentration peak, and a third concentration peak are preferably $1 \times 10^{19}$ cm$^{-3}$ or more and $4 \times 10^{22}$ cm$^{-3}$ or less. When the concentrations are below the above range, an increase effect on a threshold voltage by a fixed dipole may not be obtained. Further, it is difficult to introduce an element over the above range into a film.

According to the present embodiment, an n-channel type MISFET having both of a high mobility and a high threshold voltage can be realized.

A method for introducing each element may be followed to the embodiments described above. In accordance with the second embodiment, a multi-staked film may be used.

In the case where C is introduced into $HfO_2$, a CVD film in which a precursor including C is used may be formed. Further C may be introduced by ion plantation. Alternatively, C diffused from a substrate can be used if the substrate is oxidized.

Seventh Embodiment

In a semiconductor device according to a seventh embodiment, a gate insulating layer includes a first layer, a second layer, a first region, and a second region. The second layer is provided between the first layer and a gate electrode and has a lower oxygen density than the first layer. The first region is provided across the first layer and the second layer. The first region includes a first element which is at least one element in the group consisting of F (fluorine), D (deuterium), and H (hydrogen) and has a first concentration peak of the first element. The second region is provided in the first layer. The second region includes a second element which is at least one element in the group consisting of Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu), and has a second concentration peak of the second element.

The semiconductor device according to the present embodiment is similar to the semiconductor device according to the first embodiment other than that a gate insulating layer has a different configuration. Therefore, description of contents already described in the first embodiment will be omitted.

Figure 15A:
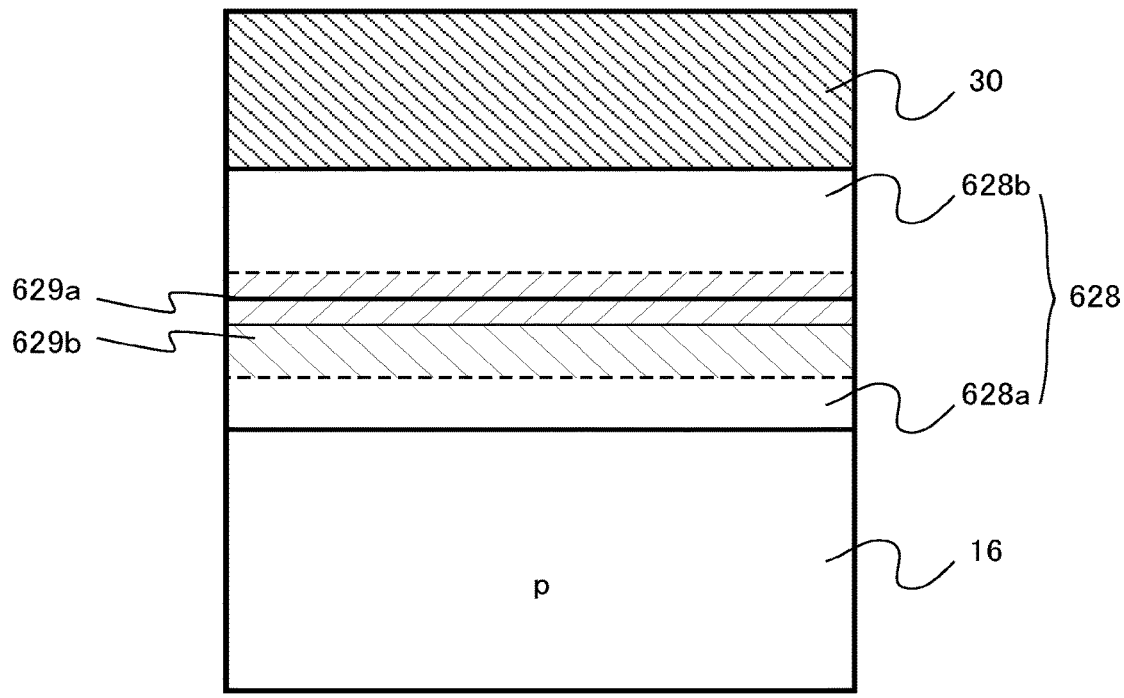
FIG. 15A is an enlarged view of a p-type SiC layer, a gate insulating layer, and a gate electrode according to a seventh embodiment.
Figure 15B:
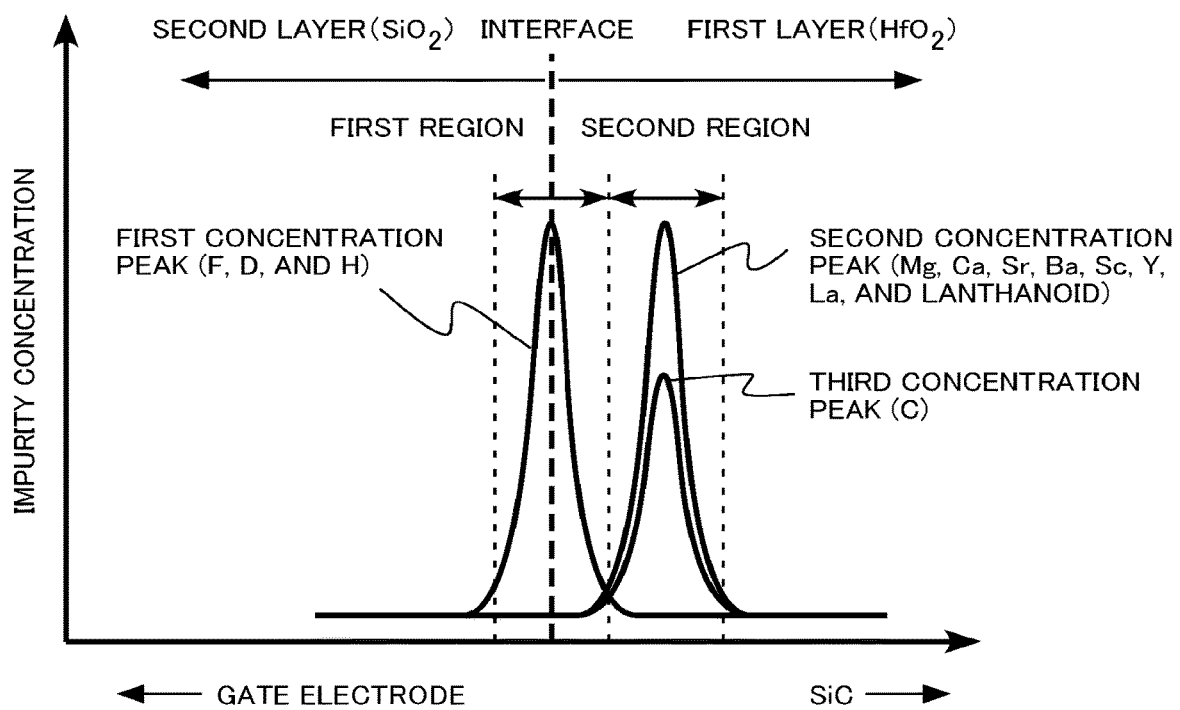
FIG. 15B illustrates element distribution of the SiC layer, the gate insulating layer, and the gate electrode.

FIG. 15A is an enlarged view of a p-type SiC layer, a gate insulating layer, and a gate electrode according to the present embodiment, and FIG. 15B illustrates element distribution of the SiC layer, the gate insulating layer, and the gate electrode. FIG. 15A is an enlarged view of a p-type SiC layer 16, a gate insulating layer 628, and a gate electrode 30, and FIG. 15B illustrates element distribution thereof.

A gate insulating layer 628 includes a first layer 628a, a second layer 628b, a first region 629a, and a second region 629b. The second layer 628b is provided between the first layer 628a and the gate electrode 30. The second layer 628b is provided on the first layer 628a.

The first layer 628a and the second layer 628b are, for example, an oxide film or an oxynitride film. The first layer 628a and the second layer 628b are, for example, a silicone oxide film, a silicon oxynitride film, a hafnium oxide film, a zirconium oxide film, and an aluminum oxide film.

An oxygen density of the second layer 628b is lower than an oxygen density of the first layer 628a. An example will be described in which the first layer 628a is a hafnium oxide film, and the second layer 628b is a silicone oxide film.

The first region 629a may be provided between the first layer 628a and the second layer 628b. The first region 629a may be provided between the first layer 628a and the second layer 628b. The first region 629a may be provided at an interface between the first layer 628a and the second layer 628b. The first region 629a includes a first element which is at least one element selected from the group consisting of F (fluorine), D (deuterium), and H (hydrogen).

The first region 629a has a first concentration peak of the first element. A full width at half maximum of the first concentration peak is equal to or less than 1 nm. The first element segregates on the interface between the first layer 628a and the second layer 628b. A concentration of the first element positioned 1 nm or more away from a concentration peak of the first element is preferably sufficiently small and equal to or less than $1 \times 10^{18}$ $cm^{-3}$. The element concentration can be confirmed by a SIMS and is preferably equal to or less than a detection limit of each element (approximately $1 \times 10^{17}$ $cm^{-3}$ or less).

The second region 629b may be provided in the first layer 628a. The second region 629b may be provided between the first region 629a and the first layer 628a. The second region 629b includes a second element which is at least one element selected from the group consisting of Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu).

The second region 629b has a second concentration peak of the second element. A full width at half maximum of the second concentration peak is equal to or less than 1 nm. A concentration of the second element positioned 1 nm or more away from a concentration peak of the second element is preferably sufficiently small and equal to or less than $1 \times 10^{18}$ $cm^{-3}$. The element concentration can be confirmed by a SIMS and is preferably equal to or less than a detection limit of each element (approximately $1 \times 10^{17}$ $cm^{-3}$ or less). A distance of the second concentration peak from the first concentration peak is equal to or less than 4 nm. A distance of the second concentration peak from the first concentration peak is preferably equal to or less than 1 nm. The second element segregates on the first layer 628a side on an interface between the first layer 628a and the second layer 628b.

The second region 629b preferably further has a third concentration peak of C (carbon) A full width at half maximum of the third concentration peak is equal to or less than 1 nm. A concentration of C positioned 1 nm or more away from a concentration peak of C is preferably sufficiently small and equal to or less than $1 \times 10^{18}$ $cm^{-3}$. The element concentration can be confirmed by a SIMS and is preferably equal to or less than a detection limit of each element (approximately $1 \times 10^{17}$ $cm^{-3}$ or less). A distance of a third concentration peak from the first concentration peak is equal to or less than 4 nm, and a distance from the second concentration peak is shorter than the distance from the first concentration peak. The third concentration peak and the second concentration peak preferably overlap. It is preferable that a top of the third concentration peak and a top of the second concentration peak are substantially in the same position.

Element concentrations and distribution thereof in the first layer 628a, the second layer 628b, the first region 629a, and the second region 629b can be calculated by, for example, a secondary ion mass spectrometry (SIMS).

Figure 16:
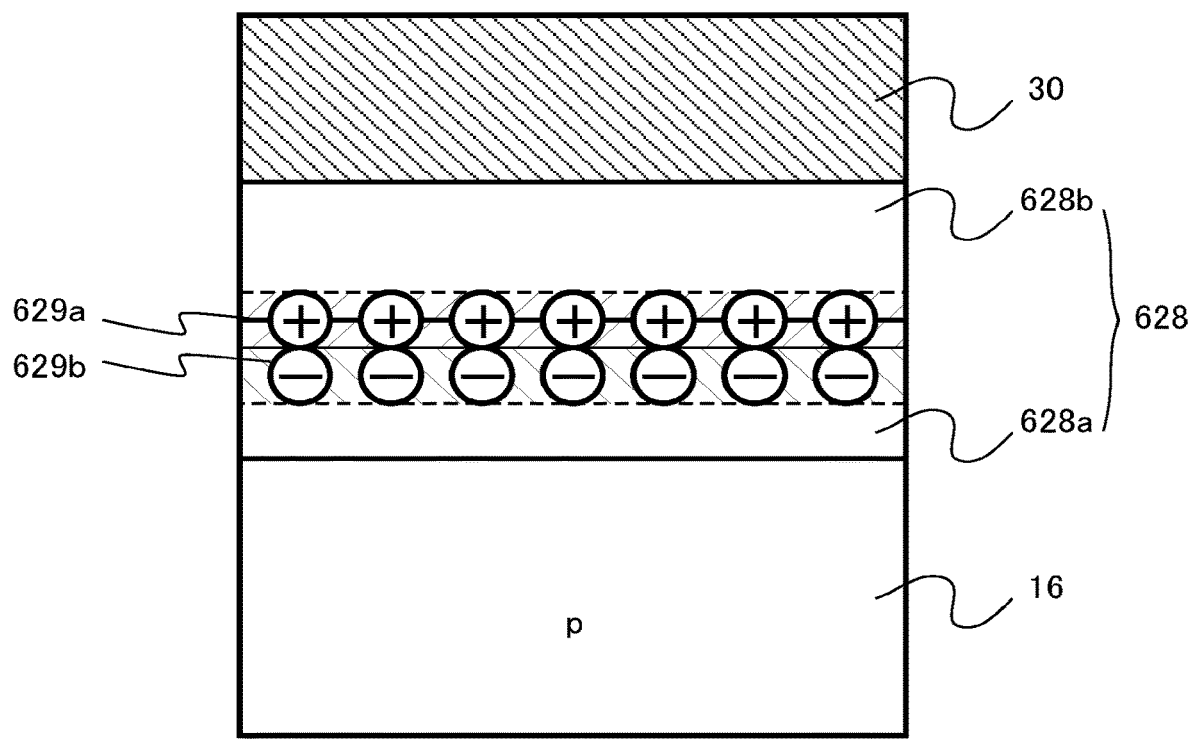
FIG. 16 is an explanatory diagram of functions and effects according to the seventh embodiment.

FIG. 16 is an explanatory diagram of functions and effects according to the present embodiment. In the present embodiment, a positive charge exists in the first region 629a, and a negative charge exists in the second region 629b neighboring the first region 629a. The positive charge and the negative charge form a fixed dipole. In the fixed dipole, a gate electrode side is a positive charge, and a SiC layer 16 side is a negative charge. Therefore, a threshold voltage of an n-channel type MISFET is increased by the fixed dipole. Accordingly, a MISFET having a high threshold voltage can be realized.

In the present embodiment, the gate insulating layer 628 has a stacked structure of the first layers 628a and the second layers 628b which have different oxygen densities. An oxygen defect density is increased on the interface between the first layer 628a and the second layer 628b which have different oxygen densities. As a result of a first principle calculation by an inventor of the present disclosure, in the case where a first element selected from F (fluorine), D (deuterium), and H (hydrogen) is introduced to an interface with an oxygen defect, the first element discharge an electron, the first element buries the oxygen defect, and the first element become a positive fixed charge. Accordingly, the first element is stabilized.

In the present embodiment, a second element selected from Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) is fixed in the first layer 628a having a high oxygen density. The second element is stabilized by coexisting with C (carbon).

Therefore, in the present embodiment, a fixed dipole is formed and stabilized since an electron is supplied from a first element selected from F (fluorine), D (deuterium), and H (hydrogen) on an interface to a second element selected from Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) in the first layer 628a having a high oxygen density.

A first concentration peak, a second concentration peak, and a third concentration peak are preferably $1\times10^{19}$ cm$^{-3}$ or more and $4\times10^{11}$ cm$^{-3}$ or less. When the concentrations are below the above range, an increase effect on a threshold voltage by a fixed dipole may not be obtained. Further, it is difficult to introduce an element over the above range into a film.

According to the present embodiment, an n-channel type MISFET having both of a high mobility and a high threshold voltage can be realized.

A method for introducing each element may be followed to the embodiments described above. In accordance with the second embodiment, a multi-staked film may be used.

Eighth Embodiment

An inverter circuit and a driving device according to an eighth embodiment are a driving device including the semiconductor device according to the first embodiment.

Figure 17:
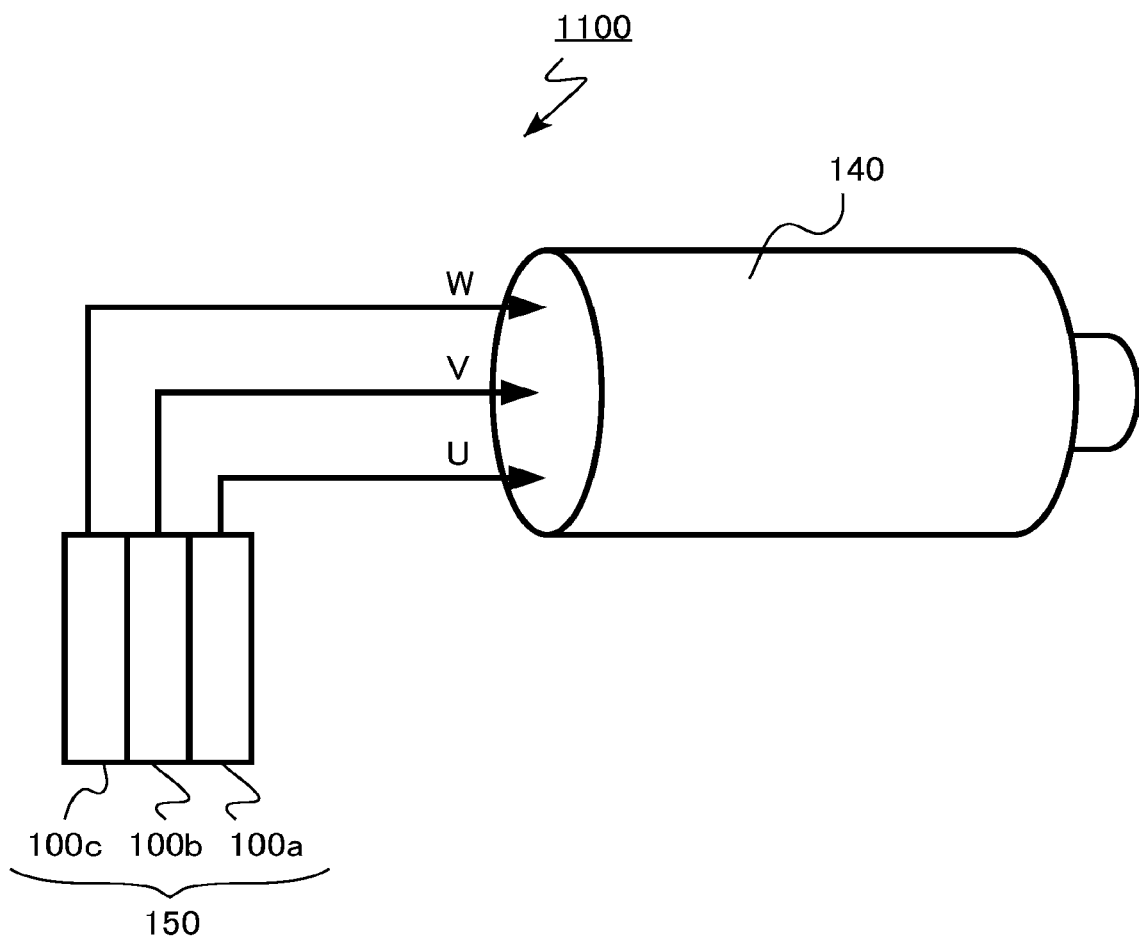
FIG. 17 is a schematic view of a driving device according to an eighth embodiment.

FIG. 17 is a schematic view of the driving device according to the present embodiment. A driving device 1100 includes a motor 140 and an inverter circuit 150.

The inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, the three-phase inverter circuit 150 including three AC voltage output terminals U, V, and W is realized. The motor 140 is driven by an AC voltage output from the inverter circuit 150.

According to the present embodiment, operation of the inverter circuit 150 and the driving device 1100 are stabilized by providing a MISFET having a high threshold voltage.

Ninth Embodiment

A vehicle according to a ninth embodiment is a vehicle including the semiconductor device according to the first embodiment.

Figure 18:
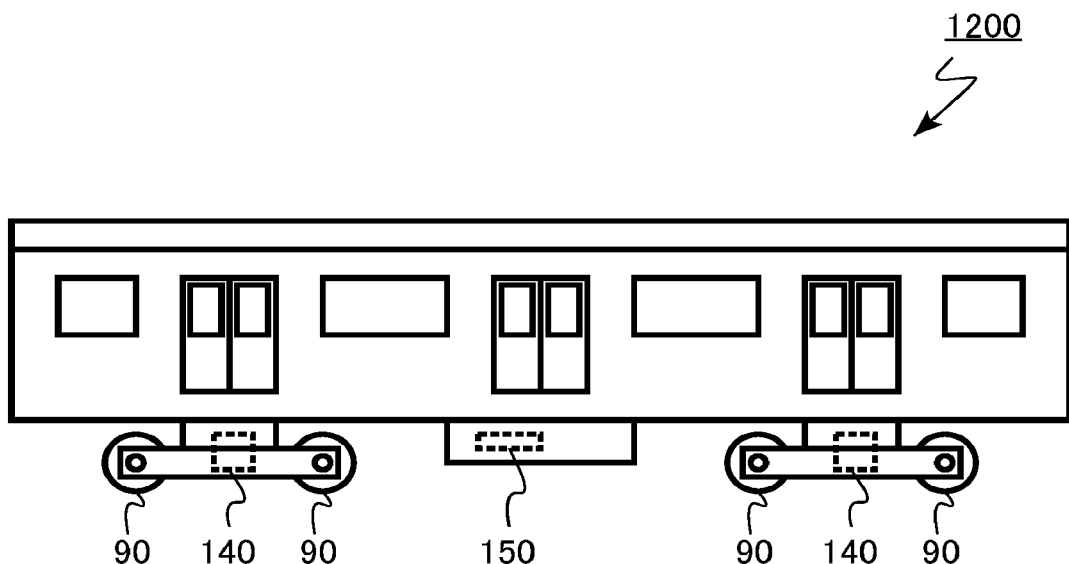
FIG. 18 is a schematic view of a vehicle according to a ninth embodiment.

FIG. 18 is a schematic view of the vehicle according to the present embodiment. A vehicle 1200 according to the present embodiment is a railroad vehicle. The vehicle 1200 includes a motor 140 and an inverter circuit 150.

The inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, the three-phase inverter circuit 150 including three AC voltage output terminals U, V, and W is realized.

The motor 140 is driven by an AC voltage output from the inverter circuit 150. A wheel 90 of the vehicle 1200 is rotated by the motor 140.

According to the present embodiment, operability of the vehicle 1200 is stabilized by including a MISFET having a high threshold voltage.

Tenth Embodiment

A vehicle according to a tenth embodiment is a vehicle including the semiconductor device according to the first embodiment.

Figure 19:
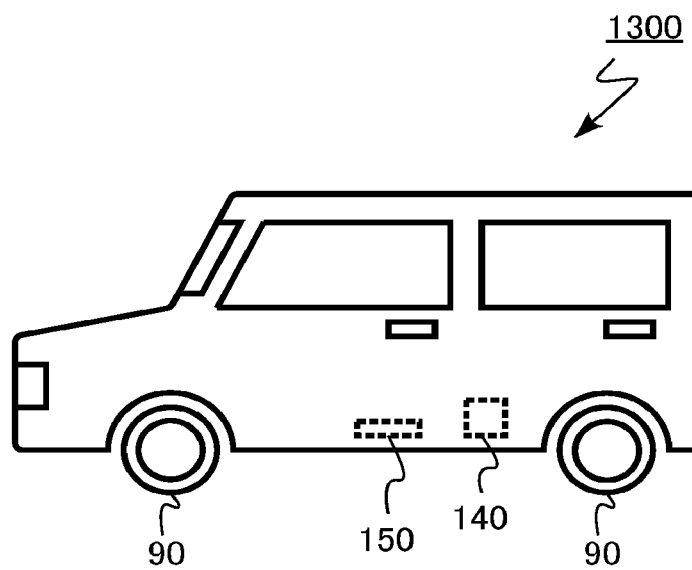
FIG. 19 is a schematic view of a vehicle according to a tenth embodiment.

FIG. 19 is a schematic view of the vehicle according to the present embodiment. A vehicle 1300 according to the present embodiment is an automobile. The vehicle 1300 includes a motor 140 and an inverter circuit 150.

The inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, the three-phase inverter circuit 150 including three AC voltage output terminals U, V, and W is realized.

The motor 140 is driven by an AC voltage output from the inverter circuit 150. A wheel 90 of the vehicle 1300 is rotated by the motor 140.

According to the present embodiment, reliability of the vehicle 1300 is improved by including a MISFET having a high threshold voltage.

Eleventh Embodiment

An elevator according to an eleventh embodiment is an elevator including the semiconductor device according to the first embodiment.

Figure 20:
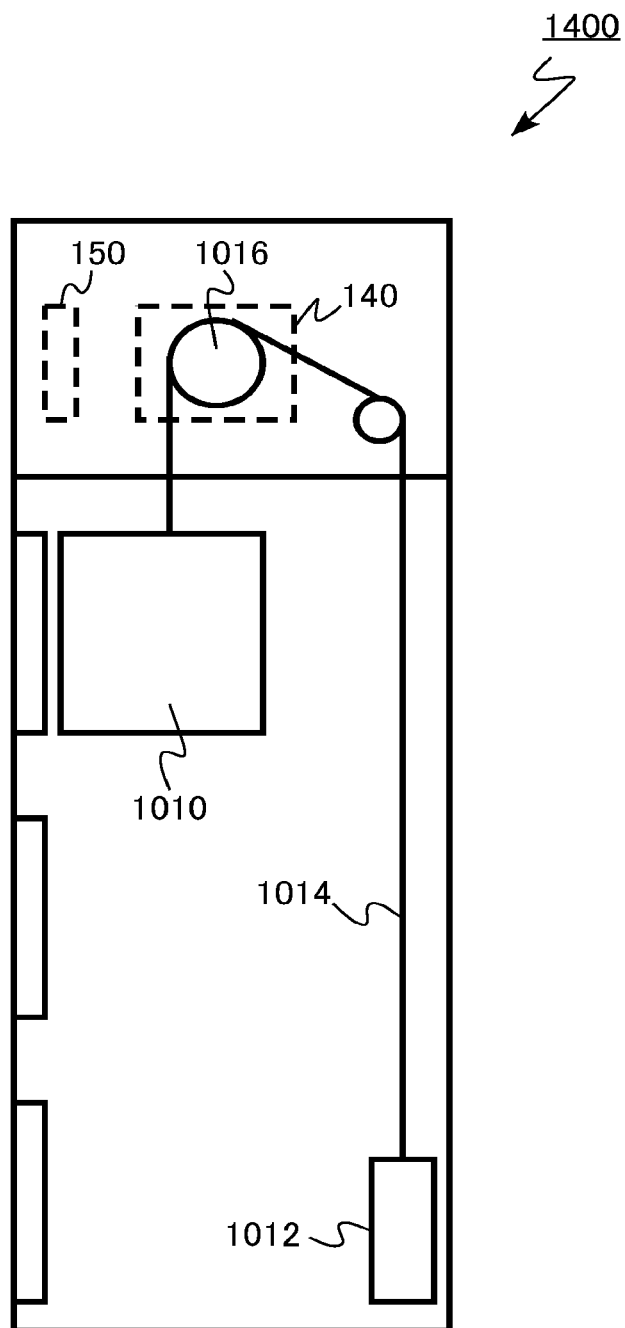
FIG. 20 is a schematic view of an elevator according to an eleventh embodiment.

FIG. 20 is a schematic view of an elevator according to the present embodiment. An elevator 1400 according to the present embodiment includes an elevator car 1010, a counterweight 1012, a wire rope 1014, a hoisting machine 1016, a motor 140, and an inverter circuit 150.

The inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, the three-phase inverter circuit 150 including three AC voltage output terminals U, V, and W is realized.

The motor 140 is driven by an AC voltage output from the inverter circuit 150. By the motor 140, the hoisting machine 1016 rotates, and the elevator car 1010 moves up and down.

According to the present embodiment, reliability of the elevator 1400 is improved by including a MISFET having a high threshold voltage.

In the first to seventh embodiments, an example in which a crystal structure of silicon carbide is 4H—SiC has been described above. However, the present disclosure can be applied to silicon carbide with other crystal structures such as 6H—SiC and 3C—SiC.

Further, in the first to seventh embodiments, the example has been described in which a MISFET is an n-channel type and a planer type. However, the present disclosure can be applied to an n-channel type and a trench type MISFET. Furthermore, the present disclosure can be applied to an n-channel type insulated gate bipolar transistor (ICBT).

In the third to seventh embodiments, a gate insulating layer can include multiple stacked structures of first layers and second layers and can include a multilayer fixed dipole.

Further, a gate insulating layer in which layer configurations in various embodiments are combined can be provided to a semiconductor device. For example, by combining the first embodiment and the seventh embodiment, an interface of a stacked film can be effectively used.

Although a conventional charge trapping film needs charge injection, an electrical charge can be injected in high density. However, the conventional charge trapping film has a problem that a threshold voltage is lowered since an electrical charge is discharged with a lapse of time. This means a trapping state is not very stable.

On the other hand, in the above embodiments, stable dipole can be formed in a gate insulating layer. The dipole is very stable. Therefore, an electrical charge does not released or introduced from the insulating layer. One concern may be a shift amount of threshold voltage cannot be increased since a trap amount cannot be increased much. However, the shift amount can be increased by using a multi-stacked film. The shift amount per dipole can be 1 to 5V. Therefore, the targeted 5V may be achieved by stacking 1 to 3 dipoles. Further, when the shift amount is increased to 7 V which is higher than 5 V, the dipole is further stabilized, and it is very effective. When the interface between a SiC layer and an insulating layer is certainly terminated, mobility is increased, but a threshold voltage is decreased. In the embodiments described above, a threshold voltage can be freely controlled by a stacked structure of a gate insulating layer independent of termination.

Further, in the ninth to eleventh embodiments, an example has been described in which the semiconductor device according to the present disclosure is applied to a vehicle and an elevator. However, the semiconductor device according to the present disclosure can be applied to, for example, a power conditioner in a solar power generation system.

While certain embodiments have been described, these embodiments have been presented by way of example only, and are not intended to limit the scope of the inventions. Indeed, the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a p-type SiC layer;
a gate electrode; and
a gate insulating layer provided between the SiC layer and the gate electrode, the gate insulating layer including:
a first layer,
a second layer provided between the first layer and the gate electrode, the second layer having a higher oxygen density than the first layer,
a first region provided across the first layer and the second layer, the first region including at least one first element selected from the group consisting of N (nitrogen), P (phosphorus), As (arsenic), Sb (antimony), and Bi (bismuth) and the first region having a first concentration peak of the at least one first element, and
a second region provided in the second layer, the second region including at least one second element selected from the group consisting of Ta (tantalum), Nb (niobium), and V (vanadium) and, the second region having a second concentration peak of the at least one second element.

2. The semiconductor device according to claim 1, wherein a distance between the second concentration peak and the first concentration peak is equal to or less than 4 nm.

3. The semiconductor device according to claim 1, wherein the second region has a third concentration peak of C (carbon), a distance between the first concentration peak and the third concentration peak is equal to or less than 4 nm, and a distance between the second concentration peak and the third concentration peak is shorter than a distance between the first concentration peak and the third concentration peak.

4. A semiconductor device, comprising:
a p-type SiC layer;
a gate electrode; and
a gate insulating layer provided between the SiC layer and the gate electrode, the gate insulating layer including:
a first layer,
a second layer provided between the first layer and the gate electrode, the second layer having a lower oxygen density than the first layer,
a first region provided across the first layer and the second layer, the first region including at least one first element selected from the group consisting of F (fluorine), D (deuterium), and H (hydrogen) and the first region having a first concentration peak of the at least one first element, and
a second region provided in the first layer, the second region including at least one second element selected from the group consisting of Mg (magnesium), Ca (calcium), Sr (strontium), Ba (barium), Sc (scandium), Y (yttrium), La (lantern), and lanthanoid (Ce, Pr, Nd, Pm, Sm, Eu, Gd, Tb, Dy, Ho, Er, Tm, Yb, and Lu) and, the second region having a second concentration peak of the at least one second element.

5. The semiconductor device according to claim 4, wherein a distance between the second concentration peak and the first concentration peak is equal to or less than 4 nm.

6. The semiconductor device according to claim 4, wherein the second region has a third concentration peak of C (carbon), a distance between the first concentration peak and the third concentration peak is equal to or less than 4 nm, and a distance between the second concentration peak and the third concentration peak is shorter than a distance between the first concentration peak and the third concentration peak.

7. An inverter circuit comprising the semiconductor device according to claim 1.

8. A vehicle comprising the semiconductor device according to claim 1.

9. An inverter circuit comprising the semiconductor device according to claim 4.

10. A vehicle comprising the semiconductor device according to claim 4.

\* \* \* \* \*